US012601799B2

(12) United States Patent
Xu et al.

(10) Patent No.: US 12,601,799 B2
(45) Date of Patent: Apr. 14, 2026

(54) MAGNETIC RESONANCE DEVICES AND RADIOFREQUENCY COILS THEREOF

(71) Applicant: SHANGHAI UNITED IMAGING HEALTHCARE CO., LTD., Shanghai (CN)

(72) Inventors: Shang Xu, Shanghai (CN); Shihao Chen, Shanghai (CN); Yunlei Yao, Shanghai (CN); Hai Lu, Shanghai (CN); Dashen Chu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 144 days.

(21) Appl. No.: 18/401,319

(22) Filed: Dec. 29, 2023

(65) Prior Publication Data

US 2024/0219491 A1     Jul. 4, 2024

(30) Foreign Application Priority Data

Dec. 29, 2022   (CN) ......................... 202211727960.9
Dec. 29, 2022   (CN) ......................... 202223532613.9
Dec. 29, 2022   (CN) ......................... 202223532614.3

(51) Int. Cl.
  *G01R 33/34*       (2006.01)
  *G01R 33/36*       (2006.01)

(52) U.S. Cl.
  CPC ... *G01R 33/34084* (2013.01); *G01R 33/3621* (2013.01)

(58) Field of Classification Search
  CPC .......... G01R 33/34084; G01R 33/3621; G01R 33/34007; G01R 33/3415; G01R 33/3664
  See application file for complete search history.

(56) References Cited

U.S. PATENT DOCUMENTS

| | | | | |
|---|---|---|---|---|
| 6,577,888 B1 * | 6/2003 | Chan | .................. | G01R 33/3415 |
| | | | | 324/318 |
| 6,650,926 B1 * | 11/2003 | Chan | .................. | G01R 33/3415 |
| | | | | 324/318 |
| 8,046,046 B2 * | 10/2011 | Chan | .................. | G01R 33/3415 |
| | | | | 333/221 |
| 2019/0154775 A1 * | 5/2019 | Stack | ................. | G01R 33/3685 |
| 2019/0377040 A1 * | 12/2019 | Stack | ............... | G01R 33/34053 |

\* cited by examiner

*Primary Examiner* — G.M A Hyder
(74) *Attorney, Agent, or Firm* — METIS IP LLC

(57)                ABSTRACT

Embodiments of the present disclosure provide a magnetic resonance device and a radiofrequency coil thereof. The radiofrequency coil includes at least one coil portion. Each of the at least one coil portion includes one or more flexible protective layers and one or more flexible coil units. The one or more flexible coil units are disposed on the one or more flexible protective layers and used to receive a magnetic resonance (MR) signal of an object. The at least one coil portion includes a first array and a second array, the first array being configured to be disposed about a first part of the object with a first curvature, the second array being configured to be disposed about a second part of the object with a second curvature, or form a hyperbolic surface structure.

18 Claims, 30 Drawing Sheets

<u>100</u>

1101

1102

1103

412

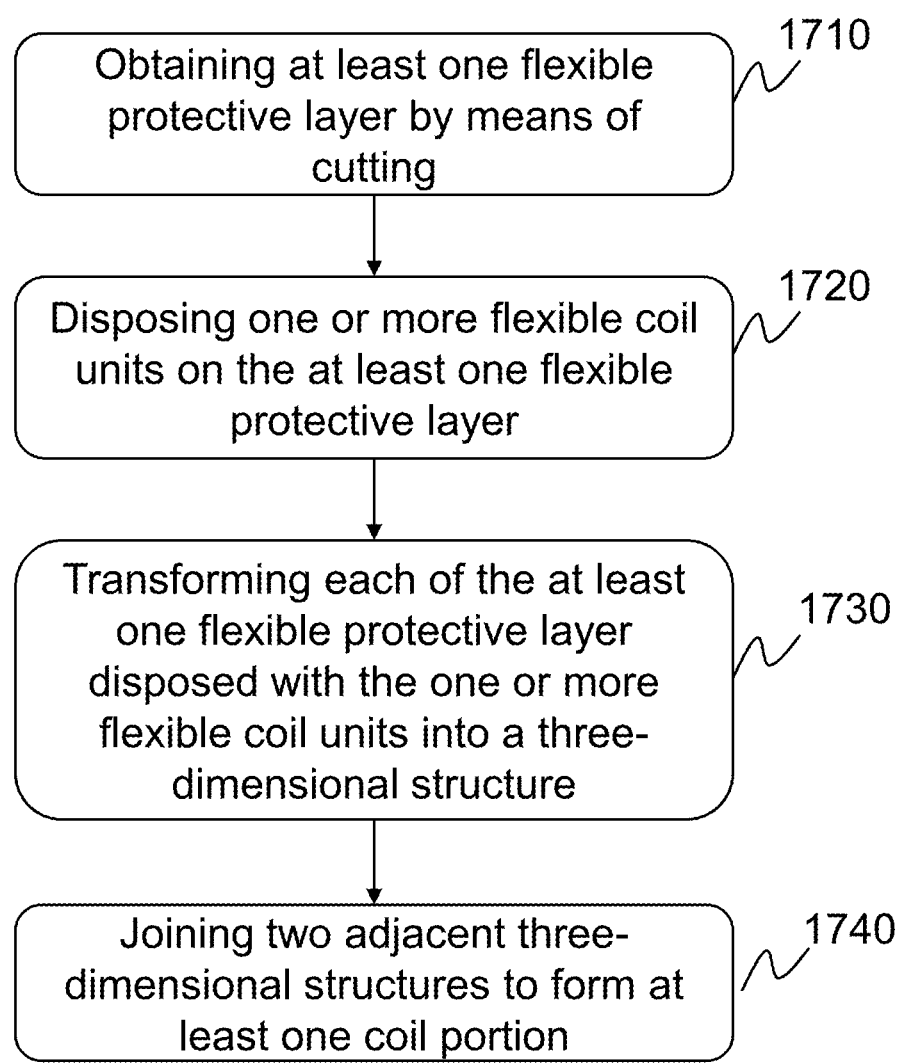

1710

Obtaining at least one flexible protective layer by means of cutting

1720

Disposing one or more flexible coil units on the at least one flexible protective layer

1730

Transforming each of the at least one flexible protective layer disposed with the one or more flexible coil units into a three-dimensional structure

1740

Joining two adjacent three-dimensional structures to form at least one coil portion

Receiving channel data corresponding to each of a plurality of flexible coil units in the radiofrequency coil          2810

Determining at least one channel group based on the channel data corresponding to the plurality of flexible coil units          2820

For each of the at least one channel group, determining a target channel from a first channel and a second channel          2830

Figure 25:
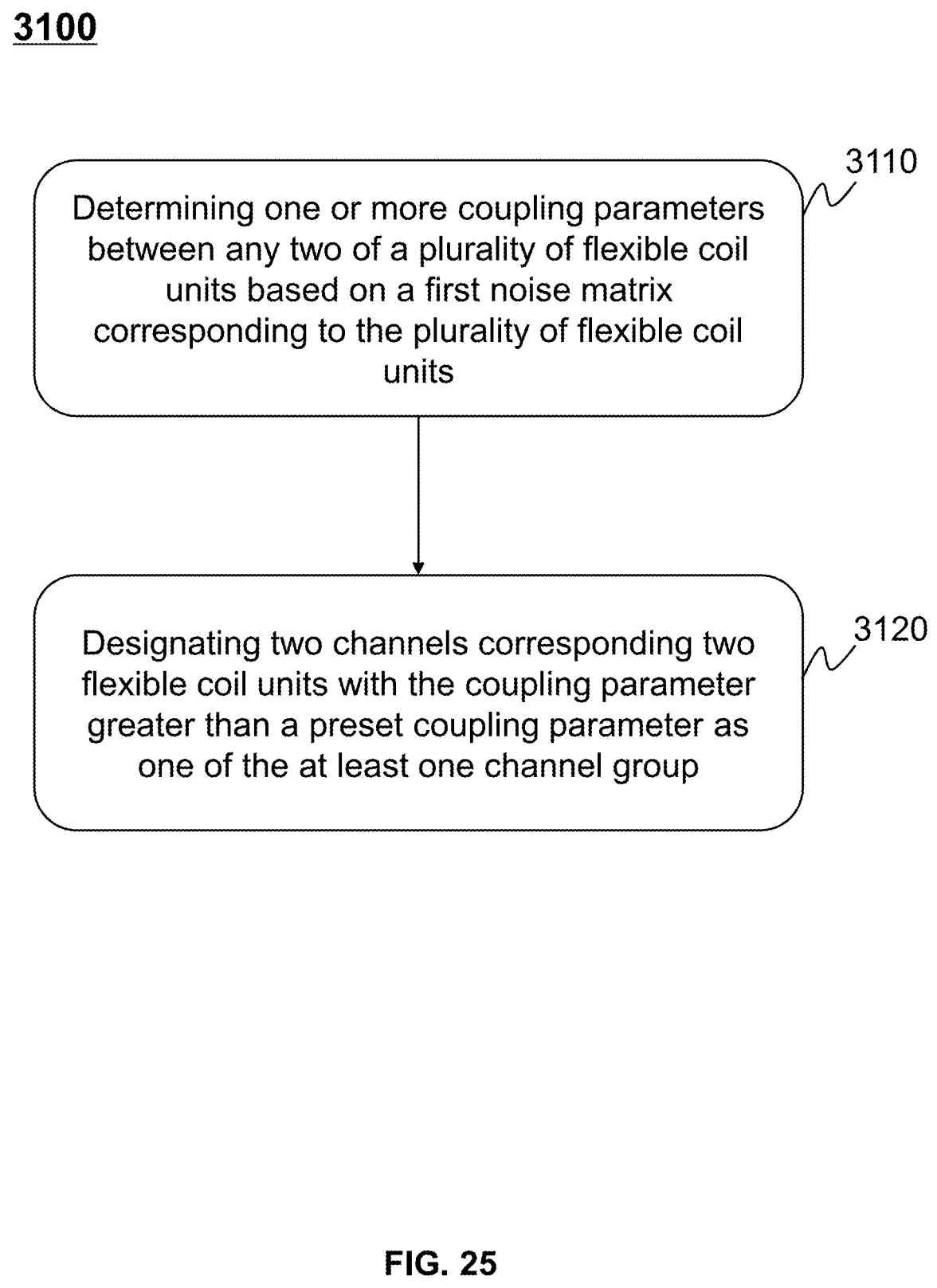

3100

Determining one or more coupling parameters between any two of a plurality of flexible coil units based on a first noise matrix corresponding to the plurality of flexible coil units    3110

Designating two channels corresponding two flexible coil units with the coupling parameter greater than a preset coupling parameter as one of the at least one channel group    3120

Figure 26:
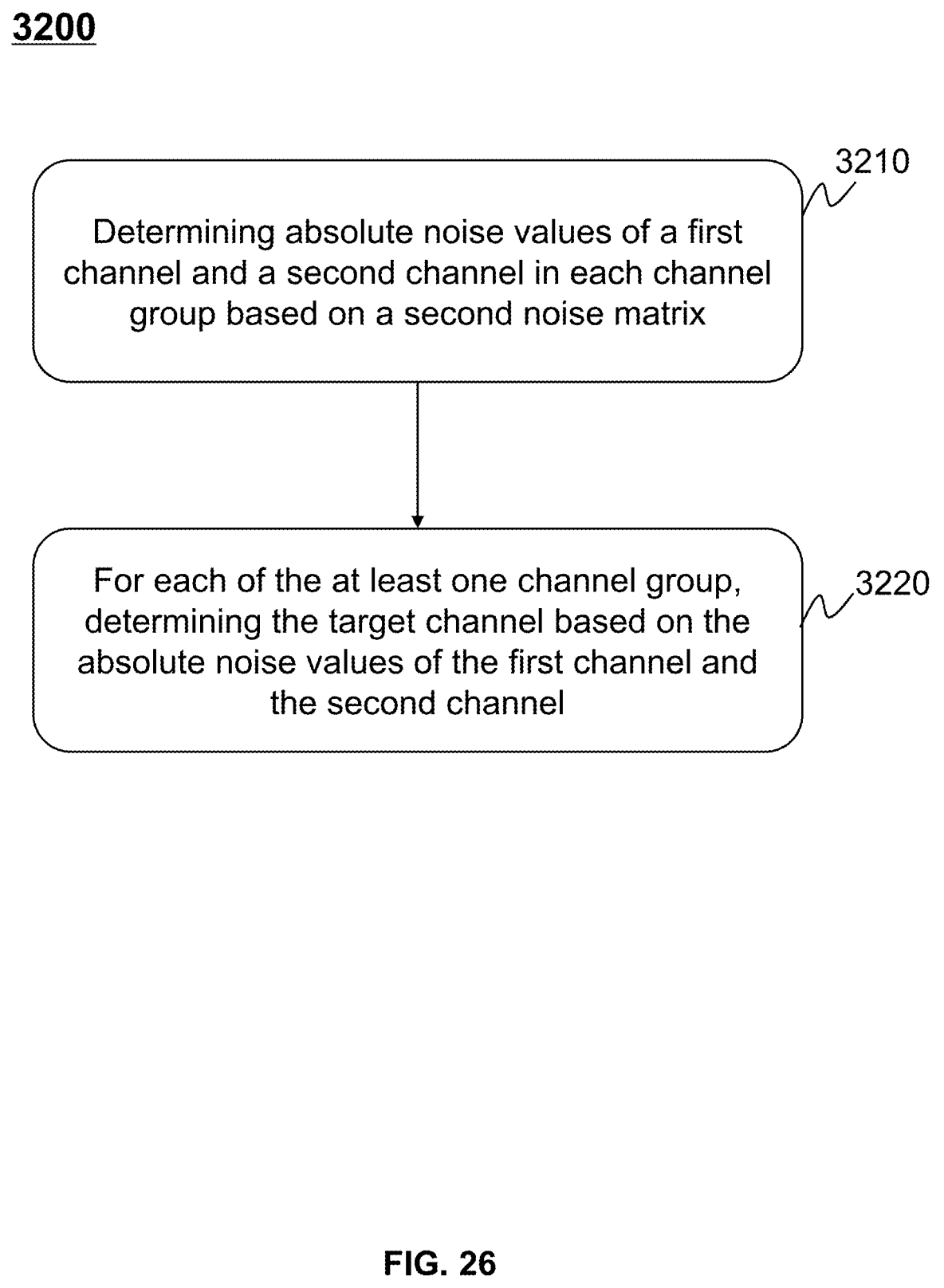

Determining absolute noise values of a first channel and a second channel in each channel group based on a second noise matrix    3210

For each of the at least one channel group, determining the target channel based on the absolute noise values of the first channel and the second channel    3220

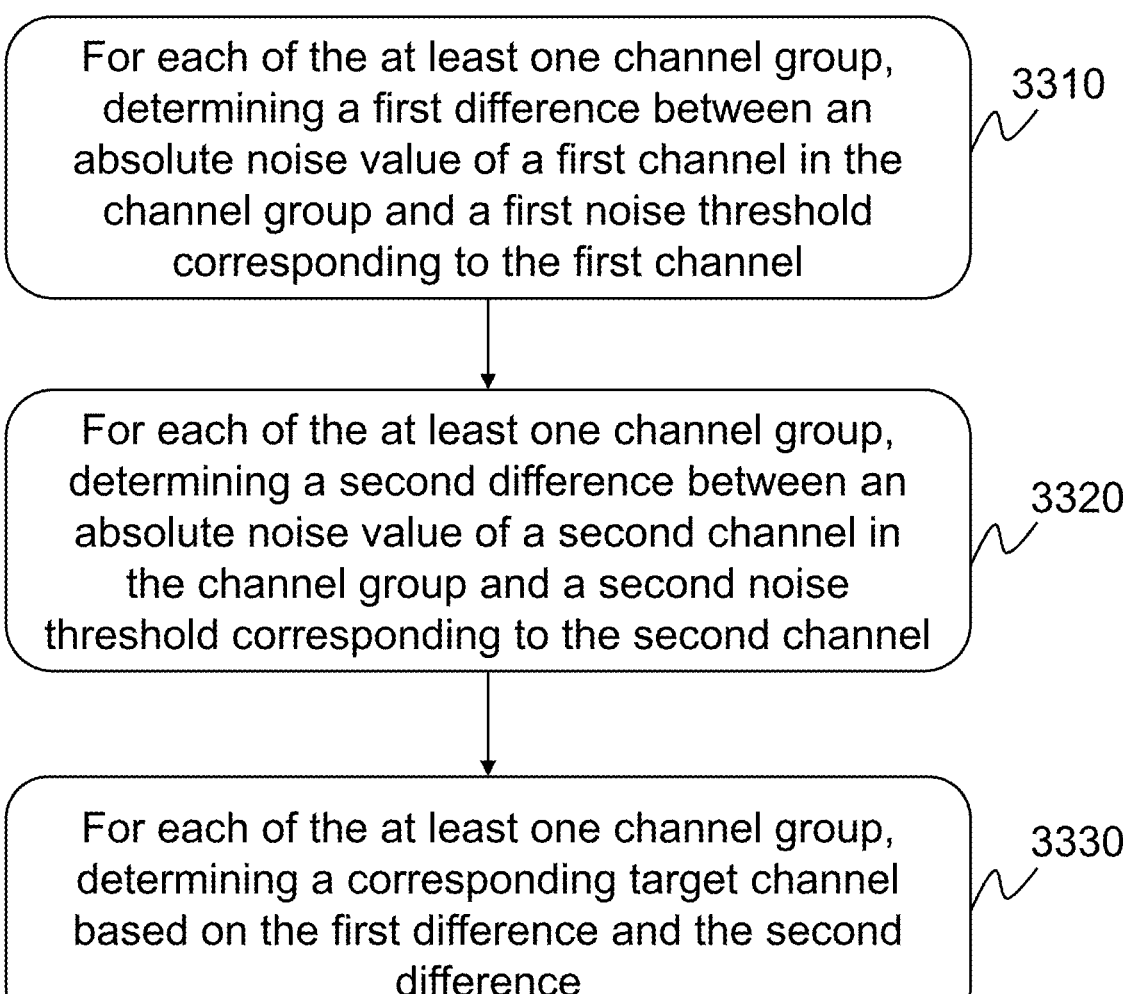

For each of the at least one channel group, determining a first difference between an absolute noise value of a first channel in the channel group and a first noise threshold corresponding to the first channel    3310

For each of the at least one channel group, determining a second difference between an absolute noise value of a second channel in the channel group and a second noise threshold corresponding to the second channel    3320

For each of the at least one channel group, determining a corresponding target channel based on the first difference and the second difference    3330

Determining a maximum value between a first absolute value and a second absolute value corresponding to a channel group    3410

Designating the channel corresponding to the maximum value as the target channel for the channel group    3420

MAGNETIC RESONANCE DEVICES AND RADIOFREQUENCY COILS THEREOF

CROSS-REFERENCE TO RELATED APPLICATIONS

This application claims priority to Chinese Patent Application No. 202223532614.3 filed on Dec. 29, 2022, Chinese Patent Application No. 202211727960.9 filed on Dec. 29, 2022, and Chinese Patent Application No. 202223532613.9 filed on Dec. 29, 2022, the entire contents of each of which are hereby incorporated by reference.

TECHNICAL FIELD

The present disclosure relates to the field of medical devices, specifically relating to a magnetic resonance device and a radiofrequency coil thereof.

BACKGROUND

In the field of medicine, medical personnel often attach a radiofrequency coil to a target scanning region of an object, enabling scanning and imaging of the object using the radiofrequency coil for magnetic resonance. However, conventional radiofrequency coils are not suitable for a complex region (e.g., the neck, elbows, shoulders, etc.) of the body, resulting in limited usability.

SUMMARY

The first aspect of the present disclosure provides a radiofrequency coil, which includes at least one coil portion. Each of the at least one coil portion includes one or more flexible protective layers and one or more flexible coil units. The one or more flexible coil units are disposed on the one or more flexible protective layers and used to receive a magnetic resonance (MR) signal of an object. The at least one coil portion includes a first array and a second array, the first array being configured to be disposed about a first part of the object with a first curvature, the second array being configured to be disposed about a second part of the object with a second curvature, or form a hyperbolic surface structure.

In some embodiments, the one or more flexible protective layers and the one or more flexible coil units are void of any capacitive and inductive lumped components.

In some embodiments, the at least one coil portion includes at least two opposite free ends, and the at least two opposite free ends are capable of detachable connection such that the at least one coil portion forms a three-dimensional structure.

In some embodiments, the at least one coil portion is a separable structure allowing for detachable connection, and the at least one coil portion is capable of covering at least a jaw region of the object and a neck region of the object.

In some embodiments, the first array is connected with the second array by a transition part to form a three-dimensional structure matching a target scanning region of the object, and a curvature of the transition part is greater than the first curvature and the second curvature.

In some embodiments, the radiofrequency coil further includes a transmission line, wherein a first end of the transmission line is connected to the one or more flexible coil units, and a second end of the transmission line extends outside the one or more flexible protective layers; or a preamplifier, wherein the preamplifier is disposed outside a carrying range of the one or more flexible protective layers, and the preamplifier is connected to the second end of the transmission line extending outside the one or more flexible protective layers.

In some embodiments, the transmission line is used to achieve impedance matching with the one or more flexible coil units.

In some embodiments, the one or more flexible protective layers include at least one of fur, fiber, or fabric.

The second aspect of the present disclosure provides a radiofrequency coil for magnetic resonance imaging (MRI). The radiofrequency coil includes at least two coil portions, and each of the at least two coil portions include one or more flexible protective layers and one or more flexible coil units. The one or more flexible coil units are disposed on the one or more flexible protective layers and used to receive a magnetic resonance (MR) signal of an object. At least one of the at least two coil portions is capable of bending in at least two directions, and a structure formed by the bending of the at least one of the at least two coil portions matches a target scanning region of the object.

In some embodiments, the at least two coil portions include a first coil portion and a second coil portion. The first coil portion includes a first main part and a first protruding part. The second coil portion includes a second main part and a first concave part. The first protruding part cooperates with the first concave part to join the first coil portion and the second coil portion.

In some embodiments, the second main part includes a first portion, a second portion, and a third portion, and the first concave part is formed with the second portion and the third portion located at two ends of the first portion, respectively. The first portion is configured to bend in a first direction, the second portion is configured to bend in a second direction, and the third portion is configured to bend in a third direction.

In some embodiments, there is an overlapping region between the bent second portion and the bent third portion.

In some embodiments, the overlapped region is connected by a connecting component.

In some embodiments, a joining manner of the first coil portion and the second coil portion is seamless joining, layered joining, or overlapping joining.

In some embodiments, the radiofrequency coil of claim 9 for magnetic resonance imaging (MRI) further includes a transmission line. A first end of the transmission line is connected to the one or more flexible coil units, a second end of the transmission line extends outside the one or more flexible protective layers and used for impedance matching with the one or more flexible coil units.

In some embodiments, the radiofrequency coil of claim 9 for magnetic resonance imaging (MRI) further includes a preamplifier. The preamplifier is disposed outside a carrying range of the one or more flexible protective layers, and connected to the second end of the transmission line extending outside the one or more flexible protective layers.

The third aspect of the present disclosure provides a radiofrequency coil for magnetic resonance imaging (MRI), which includes at least one coil portion, a transmission line, and a preamplifier. Each of the at least one coil portion includes one or more flexible protective layers and one or more flexible coil units, the one or more flexible coil units are disposed on the one or more flexible protective layers and used to receive a magnetic resonance (MR) signal of an object, and the at least one coil portion form a hyperbolic surface structure. A first end of the transmission line is connected to the one or more flexible coil units, a second end of the transmission line extends outside the one or more flexible protective layers, the transmission line is used to achieve impedance matching between the one or more flexible coil units. The preamplifier is disposed outside a carrying range of the one or more flexible protective layers, and the preamplifier is connected to the second end of the transmission line extending outside the one or more flexible protective layers.

BRIEF DESCRIPTION OF THE DRAWINGS

The present disclosure will be further illustrated by way of exemplary embodiments, which will be described in detail through the accompanying drawings. These embodiments are not limiting, and in these embodiments the same numbering indicates the same structure, wherein:

FIG. 7($b$) is a schematic diagram of a front view of the exemplary coil portion according to some embodiments of the present disclosure;

FIG. 10($b$) is a schematic diagram of an exemplary internal stitching according to some embodiments of the present disclosure;

FIG. 11 is a schematic diagram of an exemplary process for preparing at least one coil portion according to some embodiments of the present disclosure;

FIG. 14($b$) is a schematic diagram of exemplary joining of coil portions according to some other embodiments of the present disclosure;

FIG. 17($b$) is a schematic diagram of a side view of exemplary bending of the coil portions according to some embodiments of the present disclosure FIG. 18($a$) is a schematic diagram of exemplary bending of coil portions according to some embodiments of the present disclosure;

FIG. 25 is a schematic diagram of an exemplary process for determining a channel group according to some embodiments of the present disclosure;

FIG. 26 is a schematic flowchart of an exemplary process for determining a target channel according to some embodiments of the present disclosure;

FIG. 27 is a schematic flowchart of an exemplary process for determining a target channel according to some other embodiments of the present disclosure;

DETAILED DESCRIPTION

Figure 1:
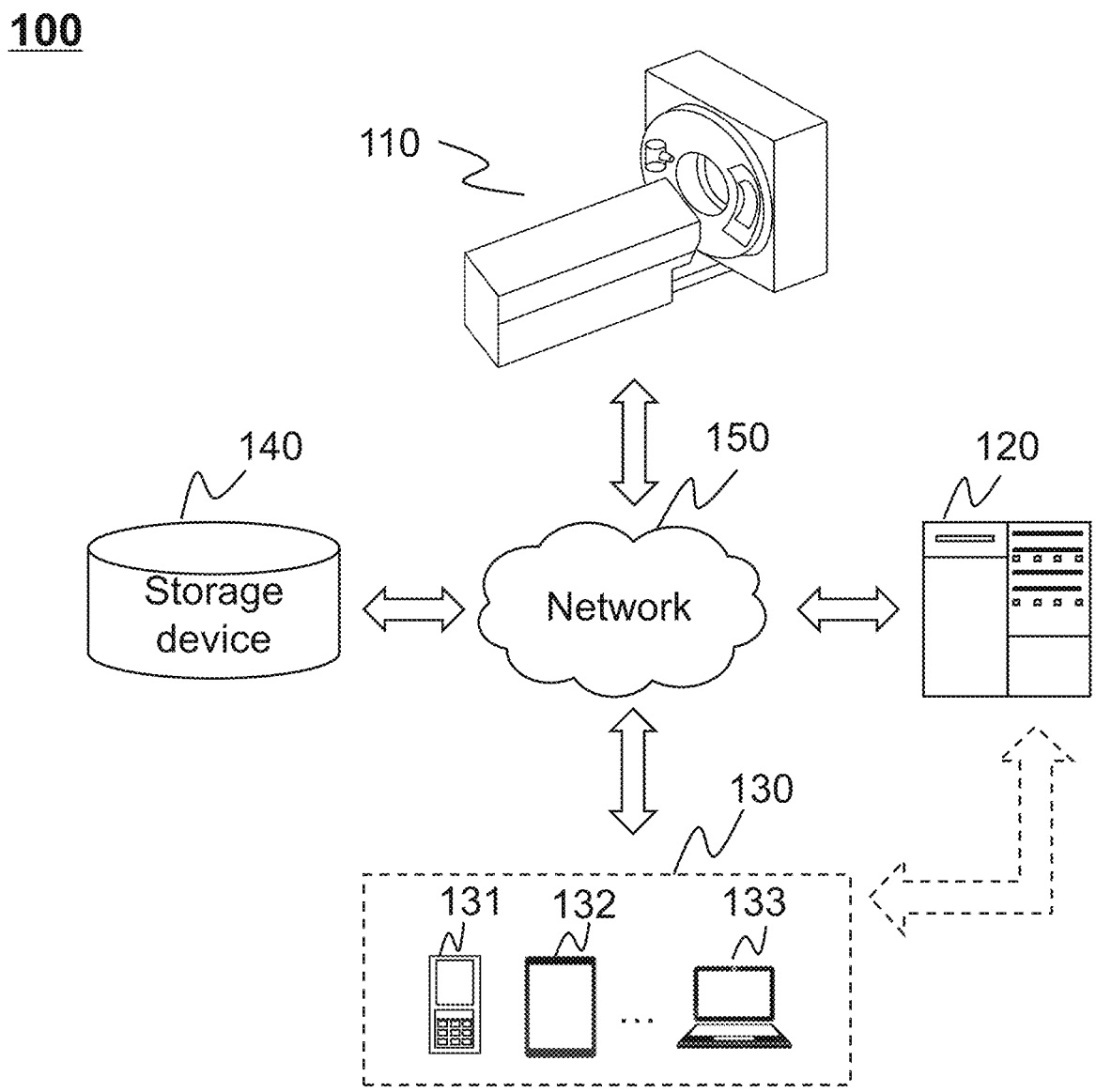
FIG. 1 is a schematic diagram of an exemplary application scenario of a magnetic resonance imaging device according to some embodiments of the present disclosure.

In order to provide a clearer understanding of the technical solutions of the embodiments described in the present disclosure, a brief introduction to the drawings required in the description of the embodiments is given below. It is evident that the drawings described below are merely some examples or embodiments of the present disclosure, and for those skilled in the art, the present disclosure may be applied to other similar situations without exercising creative labor, unless otherwise indicated or stated in the context, the same reference numerals in the drawings represent the same structures or operations.

It should be understood that the terms "system," "device," "unit," and/or "module" used in the present disclosure are used to distinguish different components, elements, parts, or assemblies at different levels. However, if other words may achieve the same purpose, they may be replaced by other expressions.

Generally, the terms "module," "unit," or "block" used here refer to logic embodied in hardware or firmware or a collection of software instructions. The modules, units, or blocks described in the present disclosure may be implemented as software and/or hardware and may be stored on any type of non-transitory computer-readable medium or another storage device. In some embodiments, software modules/units/blocks may be compiled and linked into executable programs. It should be understood that the software modules may be called from other modules/units/blocks or from themselves and/or may be called in response to detected events or interrupts. Software modules/units/blocks configured to execute on a computing device may be disposed on a computer-readable medium (e.g., a compact disc, a digital video disc, a flash drive, a disk, or any other tangible medium) as software modules/units/blocks configured to execute on a computing device, or as digital downloads (initially stored in a compressed or installable format that requires installation, decompression, or decryption before execution). The software code here may be partially or entirely stored in the storage device of a computing device that performs the operation. Software instructions may be embedded in firmware, for example, in erasable programmable read-only memory (EPROM). It should also be understood that hardware modules/units/blocks may be included in connected logic components, such as gates and triggers, and/or may include programmable units, such as programmable gate arrays or processors. The functions of the modules/units/blocks or computing devices described here may be implemented as software modules/units/blocks, but may be represented using hardware or firmware. Generally, the modules/units/blocks described here refer to logical modules/units/blocks that may be combined with other modules/units/blocks or subdivided into sub-modules/sub-units/sub-blocks, even though they are physically organized or storage devices. This description may be applied to systems, engines, or a part thereof.

It is to be understood that, unless explicitly stated otherwise in the context, when a unit, engine, module, or block is referred to as being "on," "connected" to, or "coupled to" another unit, engine, module, or block, it may be directly connected or coupled to the other unit, engine, module, or block, or there may be intermediate units, engines, modules, or blocks. In the present disclosure, the term "and/or" may include any one or more of the related listed items or their combinations. In the present disclosure, the term "image" may refer to a 2D image, a 3D image, or a 4D image.

According to the description combined with the accompanying drawings below, the functions and operation methods of these and other features, characteristics, and related structural elements of the present disclosure, as well as component combinations and manufacturing economy, may become more apparent, all of which are part of the present disclosure. However, it should be understood that the drawings are for illustrative and descriptive purposes only and are not intended to limit the scope of the present disclosure. It should also be understood that the drawings are not drawn to scale.

As shown in the present disclosure and the claims, unless explicitly indicated otherwise in the context, words such as "one," "a," "a kind of," and/or "the" do not specifically denote the singular form and may also include the plural form. In general, the terms "comprising" and "including" only suggest the inclusion of steps and elements that have been explicitly identified, and these steps and elements do not constitute an exclusive listing; methods or devices may also include other steps or elements.

Flowcharts are used in the present disclosure to illustrate the operations performed by a system according to the embodiments of the present disclosure. It should be understood that the operations mentioned earlier or later are not necessarily executed in a precise sequence. Instead, they may be processed in reverse order or simultaneously. Other operations may also be added to these processes or certain steps may be removed from these processes.

FIG. 1 is a schematic diagram of an exemplary application scenario of a magnetic resonance imaging device according to some embodiments of the present disclosure.

As shown in FIG. 1, in some embodiments, a magnetic resonance imaging (MRI) system 100 may include an imaging device 110, a processing device 120, a terminal device 130, a storage device 140, and a network 150.

The imaging device 110 may be used to scan an object or a portion of the object located in an imaging region of the imaging device 110 and generate an image related to the object or the portion of the object located in an imaging region of the imaging device 110. In some embodiments, the object may be biological or non-biological. For example, the object may include a patient, an artificial object, etc. In some embodiments, the object may include a specific body part, for example, the head, chest, abdomen, neck, shoulder, elbow, knee, etc., or any combination thereof. In some embodiments, the object may include a specific organ, for example, the heart, esophagus, trachea, bronchi, stomach, gallbladder, small intestine, colon, bladder, ureter, uterus, fallopian tubes, etc., or any combination thereof. In some embodiments, the object may include a region of interest (ROI), for example, a tumor, a nodule, etc.

In some embodiments, the imaging device 110 may include one of an X-ray device, a computer tomography (CT) imaging device, a three-dimensional (3D) CT imaging device, a four-dimensional (4D) CT imaging device, an ultrasound imaging component, a fluorescent imaging component, a magnetic resonance imaging (MRI) device, a single-photon emission computed tomography (SPECT) device, a positron emission tomography (PET) device, or a combination thereof.

In some embodiments, the imaging device 110 may be a magnetic resonance device (e.g., magnetic resonance device 3600). The magnetic resonance device may include a main magnet, a gradient coil, and a radiofrequency (RF) coil. The main magnet may generate a first magnetic field (also called a main magnetic field) used to polarize the object. For example, the main magnet may include a permanent magnet, a superconducting electromagnet, a resistive electromagnet, etc. The gradient coil may generate a second magnetic field (also called a gradient magnetic field). For example, the gradient coil may include an X gradient coil, a Y gradient coil, and a Z gradient coil. The gradient coil may generate one or more magnetic field gradient pulses in an X direction (Gx), a Y direction (Gy), and a Z direction (Gz) with respect to the main magnetic field to encode spatial information of the object. The RF coil may include one or more RF emitting coils and/or one or more RF receiving coils. The one or more RF emitting coils may emit a RF pulse to the object (e.g., a target scanning region). With the cooperation of the main magnetic field/the gradient magnetic field and RF pulse, a magnetic resonance signal related to the object may be generated according to a pulse sequence. The one or more RF receiving coils may receive the magnetic resonance signal from the object according to the pulse sequence.

In some embodiments, the radiofrequency (RF) coil (e.g., a radiofrequency coil 400) may include at least one coil portion, a transmission line, and a preamplifier. The at least one coil portion includes one or more flexible coil units, and the one or more flexible coil units are used to receive a magnetic resonance (MR) signal of an object. One end (e.g., a first end) of the transmission line is connected to the one or more flexible coil units, another end (e.g., a second end) of the transmission line extends outside a flexible protective layer corresponding to the one or more flexible coil units and is connected to the preamplifier. The transmission line is used for impedance matching with the one or more flexible coil units. The preamplifier is used to amplify the MR signal received by the one or more flexible coil units. For more related content, please refer to other parts (e.g., FIGS. 4-30 and related descriptions) of the present disclosure.

The processing device 120 may process data and/or information obtained from the imaging device 110, the terminal device 130, and/or the storage device 140. For example, the processing device 120 may determine at least one channel group from channel data corresponding to each of a plurality of flexible coil units of the imaging device 110, and determine a target channel from a first channel and a second channel for each of the at least one channel group. As another example, the processing device 120 may control resonance of the target channel during a magnetic resonance scan of the object, and control a channel over-coupled with the target channel to be off-resonance. In some embodiments, the processing device 120 may be a single server or a server group. The server group may be centralized or distributed. In some embodiments, the processing device 120 may be local or remote. For example, the processing device 120 may access the information and/or the data from the imaging device 110, the terminal device 130, and/or the storage device 140 through the network 150. As another example, the processing device 120 may be directly connected to the imaging device 110, the terminal device 130, and/or the storage device 140 to access the information and/or the data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or any combination thereof. In some embodiments, the processing device 120 may be a part of the imaging device 110. For example, the processing device 120 may be integrated within the imaging device 110.

The terminal device 130 may include a mobile device 131, a tablet 132, a laptop 133, etc., or any combination thereof. In some embodiments, the terminal device 130 may interact with other components of the magnetic resonance imaging (MRI) system 100 through the network 150. For example, the terminal device 130 may send one or more control instructions to the imaging device 110 through the network 150 to control the imaging device 110 to scan the object according to the one or more control instructions. In some embodiments, the mobile device 131 may include a smart home device, a wearable device, a mobile device, a virtual reality device, an augmented reality device, etc., or any combination thereof.

In some embodiments, the terminal device 130 may be a part of the processing device 120. In some embodiments, the terminal device 130 may be integrated with the processing device 120 as an operational console for the imaging device 110. For example, a user/an operator (e.g., a doctor or a nurse) of the magnetic resonance imaging (MRI) system 100 may control operation of the imaging device 110 through the console, for example, to perform a scan on the object.

The storage device 140 may store data (e.g., a magnetic resonance image, etc.), an instruction, and/or any other information. In some embodiments, the storage device 140 may store data the obtained from the imaging device 110, processing device 120, and/or terminal device 130. In some embodiments, the storage device 140 may store data and an instruction that the processing device 120 may execute or use to perform an exemplary method described in the present disclosure.

In some embodiments, the storage device 140 may include one or a combination of a high-capacity storage, a removable storage, a volatile read-write memory, a read-only memory (ROM). In some embodiments, the storage device 140 may be implemented through the cloud platform described in the present disclosure.

In some embodiments, the storage device 140 may be connected to the network 150 to facilitate communication with one or more components (e.g., the processing device 120, the terminal device 130) within the magnetic resonance imaging (MRI) system 100. The one or more components within the magnetic resonance imaging (MRI) system 100 may read the data or the instruction from the storage device 140 through the network 150. In some embodiments, the storage device 140 may be a part of the processing device 120, or may be independent and connected to the processing device 120 directly or indirectly.

The network 150 may include any suitable network that facilitates exchange of information and/or data for the magnetic resonance imaging (MRI) system 100. In some embodiments, one or more components (e.g., the imaging device 110, the processing device 120, the terminal device 130, and the storage device 140) within the magnetic resonance imaging (MRI) system 100, may exchange the information and/or the data with the one or more components of the magnetic resonance imaging (MRI) system 100 through the network 150. For example, the processing device 120 may obtain data corresponding to a plurality of channels of the plurality of flexible coil units from the imaging device 110 through the network 150. In some embodiments, the network 150 may include one of a public network (e.g., the Internet), a private network (e.g., a local area network (LAN), a wide area network (WAN), etc.), a wired network (e.g., an Ethernet), a wireless network (e.g., an 802.11 network, a wireless Wi-Fi network, etc.), a cellular network (e.g., a Long-Term Evolution (LTE) network), a frame relay network, a virtual private network (VPN), a satellite network, a telephone network, a router, a hub, a server computer, etc., or a combination thereof. In some embodiments, the network 150 may include one or more network access points. For example, the network 150 may include a wired and/or a wireless network access point.

It should be noted that the description of the magnetic resonance imaging (MRI) system 100 provided above is for illustrative purposes only and is not intended to limit the scope of the present disclosure. Those skilled in the art may make various changes and modifications within the scope of the present disclosure's content. The features, structures, methods, and other characteristics of the exemplary embodiments described in the present disclosure may be combined in various ways to obtain additional and/or alternative exemplary embodiments. However, such changes and modifications do not depart from the scope of the present disclosure.

The radiofrequency coil is a device used to obtain a magnetic resonance (MR) signal. In some embodiments, the magnetic resonance signal may be an electromagnetic wave generated from a specimen (e.g., the target scanning region of the object). MR signal intensity is related to relaxation time (e.g., T1, T2), hydrogen proton density, blood or cerebrospinal fluid flow, chemical shift, and magnetic susceptibility, and plays an important role in image contrast, thereby reflecting an internal structure of the specimen. For example, a magnetic resonance signal generated from a human tissue may reflect an internal structure of a human body. In some embodiments, the magnetic resonance signal may be a filtered radiofrequency signal. In some embodiments, the radiofrequency coil may conform to the human tissue to collect one or more magnetic resonance signals from feedback of the human tissue. In some embodiments, the radiofrequency coil may also amplify the magnetic resonance signal and output a processed magnetic resonance signal.

In some embodiments, the radiofrequency coil may be used to receive the magnetic resonance signal for various signal analysis scenarios. For example, in the imaging device 110, the radiofrequency coil provides information corresponding to the magnetic resonance signal (e.g., spatial data, an image, etc.) for disease assessment or scientific analysis. As another example, in a detection device, the radiofrequency coil provides detection information such as a material composition, a material distribution, etc., corresponding to the magnetic resonance signal.

Figure 2:
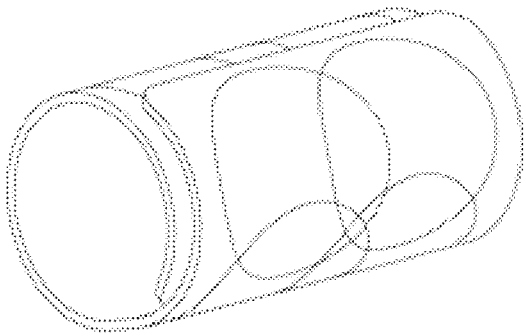
FIG. 2 is a schematic diagram of an exemplary conventional radiofrequency coil for magnetic resonance imaging.

The radiofrequency coil used in magnetic resonance devices is generally a simple flat planar structure that, when not in use, resembles a flat sheet of paper and may only be bent in a single direction when in use. FIG. 2 is a schematic diagram of an exemplary conventional radiofrequency coil for magnetic resonance imaging. As shown in FIG. 2, the radiofrequency coil used in current magnetic resonance devices may be bent into a cylindrical shape along one direction by medical staff when in use. This type of radiofrequency coil is mainly used for a cylindrical body part such as the torso and limbs, making it challenging to attach to a joint with a sharp angle. For example, when scanning a region like the shoulders, elbows, neck, or other parts that require bending at a specific angle, the radiofrequency coil shown in FIG. 2 may not bend in a plurality of directions, limiting its applicability for imaging complex regions of the body.

Figure 3:
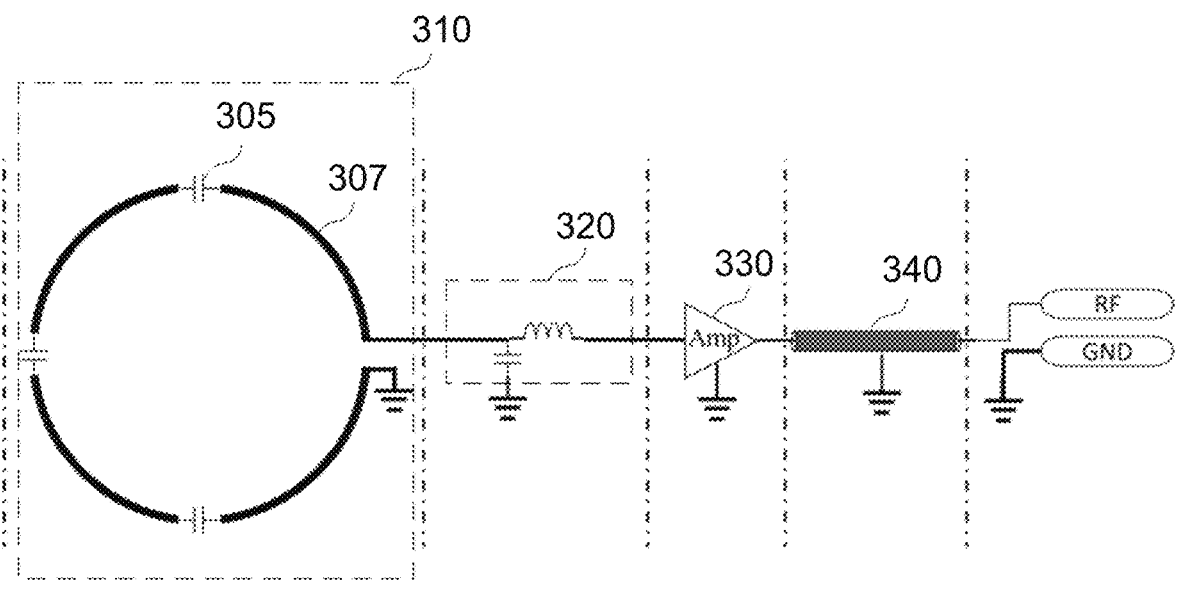
FIG. 3 is a schematic diagram of an exemplary circuit of a conventional radiofrequency coil for magnetic resonance imaging.

FIG. 3 is a schematic diagram of an exemplary circuit of a conventional radiofrequency coil for magnetic resonance imaging. As shown in FIG. 3, the conventional radiofrequency coil for magnetic resonance imaging includes a coil unit 310, a matching circuit 320, an amplifier 330, and a transmission line 340. The coil unit 310 includes discrete capacitors 305 and conductive wires 307 tuned by the discrete capacitors 305. As shown in FIG. 3, the conventional radiofrequency coil for magnetic resonance imaging has a matching circuit 320 composed of rigid discrete components or a printed circuit board (PCB). Because the discrete capacitors 305 and the matching circuit 320 are all rigid components, this not only reduces flexibility of the radiofrequency coil but also affects conformity of the radiofrequency coil to a surface of an imaged object. Furthermore, these rigid components take up space inside the radiofrequency coil. Therefore, the conventional radiofrequency coil for magnetic resonance imaging is limited in its degree of bending.

In some embodiments of the present disclosure, a radiofrequency coil (e.g., a radiofrequency coil 400) is provided, including at least one coil portion, a transmission line, and a preamplifier. The at least one coil portion includes one or more flexible protective layers and one or more flexible coil units, the one or more flexible coil units are disposed on the one or more flexible protective layers and used to receive a magnetic resonance (MR) signal of an object. One end (e.g., a first end) of the transmission line is connected to the one or more flexible coil units, another end (e.g., a second end) of the transmission line extends outside the one or more flexible protective layers of the one or more flexible coil units and is connected to the preamplifier. The transmission line is used for impedance matching with the one or more flexible coil units. The preamplifier is used to amplify the MR signal received by the one or more flexible coil units.

In some embodiments, the at least one coil portion is capable of covering at least a jaw region of the object and a neck region of the object. In some embodiments, the radiofrequency coil includes at least two coil portions, wherein at least one of the at least two coil portions is capable of bending in at least two directions, and a structure formed by the bending of the at least one of the at least two coil portions matches the target scanning region of the object. By configuring the structure of the at least one coil portion, the radiofrequency coil may be applied to detecting complex parts of the object, expanding the applicability of the radiofrequency coil for magnetic resonance imaging.

The following provides a detailed introduction to the radiofrequency coil for magnetic resonance imaging in the present disclosure.

Figure 4:
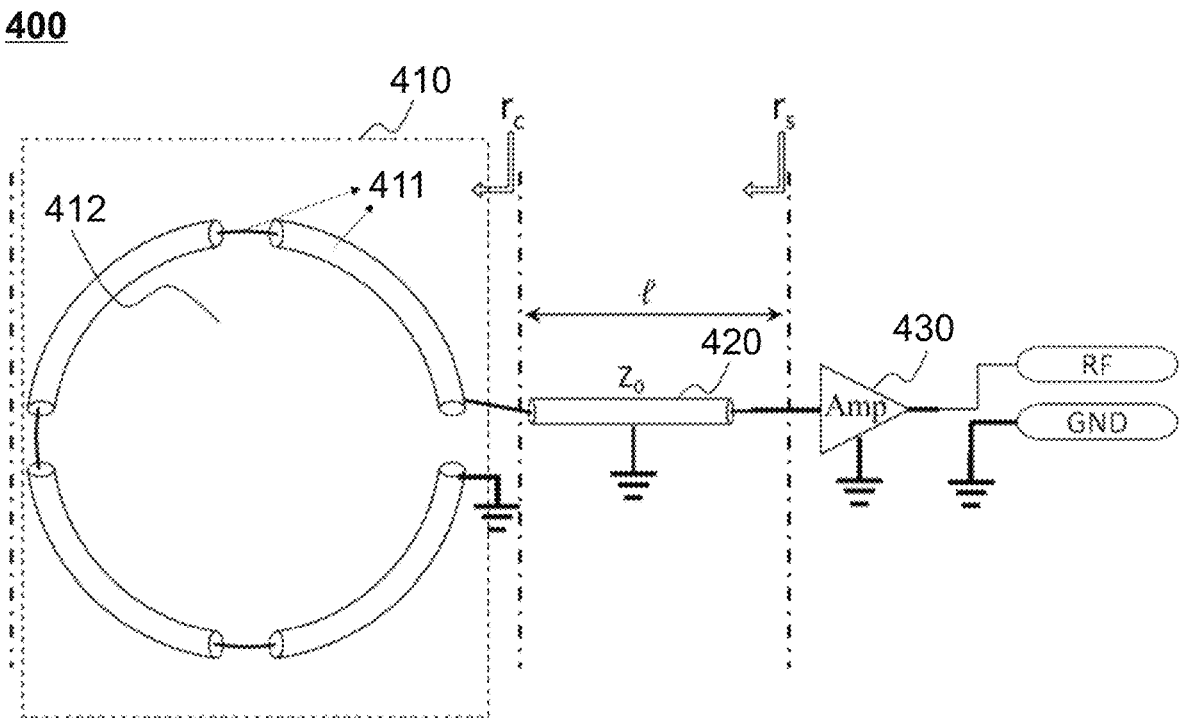
FIG. 4 is a schematic diagram of an exemplary circuit structure of a radiofrequency coil according to some embodiments of the present disclosure.

FIG. 4 is a schematic diagram of an exemplary circuit structure of a radiofrequency coil according to some embodiments of the present disclosure.

In some embodiments, as shown in FIG. 4, the radiofrequency coil 400 may include at least one coil portion 410, a transmission line 420, and a preamplifier 430.

The at least one coil portion 410 may be a device for receiving a radiofrequency signal. For example, the at least one coil portion 410 may receive the radiofrequency signal within a preset frequency range by sensing radiation of an electromagnetic wave in the preset frequency range. In some embodiments, the at least one coil portion 410 may conform to a human tissue to receive a magnetic resonance signal from the human tissue.

In some embodiments, the at least one coil portion may be capable of covering at least a jaw region of an object and a neck region of the object. In some embodiments, the radiofrequency coil 400 may include one coil portion that may cover the jaw region and the neck region of the object. In some embodiments, the radiofrequency coil 400 may include two or more coil portions, and the two or more coil portions, when combined, may cover the jaw region and the neck region of the object. More details may be found in the descriptions of FIGS. 15 to 19.

In some embodiments, the radiofrequency coil 400 includes at least two coil portions, wherein at least one of the at least two coil portions is capable of bending in at least two directions, and a structure formed by the bending of the at least one of the at least two coil portions matches a target scanning region of the object. More details may be found in the descriptions of FIGS. 12 to 21.

In some embodiments, the at least one coil portion 410 may include one or more flexible coil units 412 for receiving the magnetic resonance signal. In some embodiments, the at least one coil portion 410 also includes one or more flexible protective layers, and the one or more flexible coil units 412 are disposed on the one or more flexible protective layers. In some embodiments, the at least one coil portion 410 may include at least one flexible protective layer. In some embodiments, the at least one coil portion 410 may include at least two flexible protective layers.

In some embodiments, the one or more flexible protective layers may include at least one of fur, fiber, or fabric. For example, the one or more flexible protective layers may be silk, cotton, fur, fiber, polyester, etc. Since the one or more flexible protective layers are a deformable material such as the fur or the fabric, the at least one coil portion may form a three-dimensional structure to match the target scanning region of the object. In some embodiments, the one or more flexible protective layers may include at least one layer. For example, the one or more flexible protective layers may include a single layer of fabric. As another example, the one or more flexible protective layers may include two layers: a covering layer and an intermediate layer. As yet another example, the one or more flexible protective layers may include three layers: a waterproof layer, a filtering layer, and a base spun fabric layer.

In some embodiments, the flexible coil unit 412 may be stitched on a surface of the one or more flexible protective layers or stitched between the two layers of the one or more flexible protective layers. In some embodiments, the flexible coil unit 412 may be attached to the one or more flexible protective layers using adhesive, or interwoven between the layers of the one or more flexible protective layers in a top-to-bottom or bottom-to-top manner. The present disclosure does not impose specific restrictions on the placement of the flexible coil unit on the one or more flexible protective layers.

In some embodiments, to improve utilization of the scanning region of the radiofrequency coil 400, each covered region of the one or more flexible protective layers may be disposed with the one or more flexible coil units 412. Furthermore, to better adhere the one or more flexible coil units to the one or more flexible protective layers, an edge of the one or more flexible protective layers may be set to be curved or rounded. It should be understood that, to ensure scanning effect, the one or more flexible coil units may be evenly distributed within the one or more flexible protective layers, with overlapping regions between the one or more flexible coil units. More details regarding the at least one coil portion may be found in the descriptions of FIGS. 5 to 9.

In some embodiments, one end (e.g., a first end) of the transmission line 420 is connected to the one or more flexible coil units 412, another end (e.g., a second end) of the transmission line 420 extends outside the one or more flexible protective layers of the one or more flexible coil units 412 (or outside the at least one coil portion 410) and is connected to the preamplifier 430. The transmission line 420 is used for impedance matching with the one or more flexible coil units 412. The preamplifier 430 is used to amplify the magnetic resonance signal received by the one or more flexible coil units 412. As shown in FIG. 4, the preamplifier 430 may be disposed at a signal output end of the transmission line 420, where the transmission line 420 transmits the magnetic resonance signal received by the one or more flexible coil units 412 to the preamplifier 430. The preamplifier 430 may provide gain to the magnetic resonance signal, amplifying the magnetic resonance signal. By separating the preamplifier 430 from the one or more flexible coil units 412, i.e., separating the preamplifier 430 from the at least one coil portion 410, space within the at least one coil portion can be saved, increasing the flexibility of the radiofrequency coil.

In some embodiments, the at least one coil portion 410 may include a flexible conductive wire. The flexible conductive wire wraps around to form the one or more flexible coil units 412. In some embodiments, the flexible conductive wire in the at least one coil portion may wrap around to form one or more flexible coil units. The one or more flexible coil units may receive the magnetic resonance signal through electromagnetic induction and output the magnetic resonance signal to other devices or equipment (e.g., the preamplifier 430, etc.).

In some embodiments, a count of the one or more flexible coil units 412 in the at least one coil portion 410 may be one. As shown in FIG. 4, an output end of the single flexible coil unit 412 may be connected to a signal input end of the Amp 430 (i.e., the preamplifier 430), and one end of the single flexible coil unit 412 that is away from the signal output end may be connected to ground. In some embodiments, the single flexible coil unit may receive one magnetic resonance signal or receive a plurality of magnetic resonance signals in a time-division manner.

Figure 12:
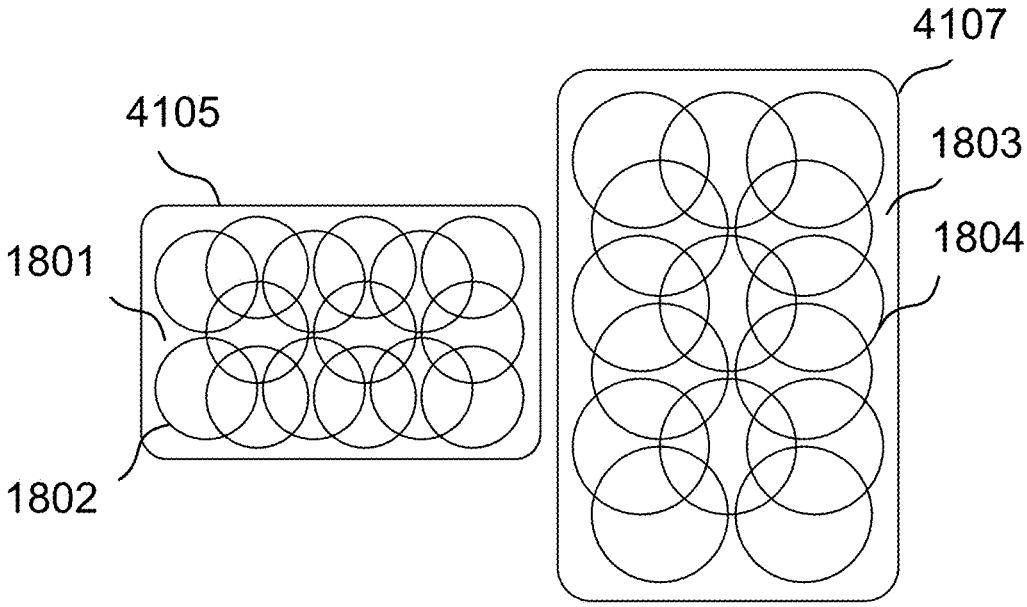
FIG. 12 is a schematic diagram of structures of exemplary coil portions according to some other embodiments of the present disclosure.

In some embodiments, a count of the one or more flexible coil units 412 in the at least one coil portion 410 may be more than one (as shown in FIG. 7(*a*) and FIG. 7(*b*) or FIG. 12), and a plurality of flexible coil units may be connected in parallel. For example, output ends of the plurality of flexible coil units 412 may all be coupled to the transmission line 120, allowing the magnetic resonance signals received by each of the plurality of flexible coil units 412 to be transmitted to the preamplifier 430. Furthermore, two ends of each of the plurality of flexible coil units 412 may be coupled to the transmission line 420. In some embodiments, the plurality of flexible coil units 412 may simultaneously receive a plurality of magnetic resonance signals to improve imaging efficiency.

Compared to the conventional radiofrequency coil array set within a PCB board, the flexible radiofrequency coil described in the present disclosure can conform more closely to the human tissue, thereby improving a signal-to-noise ratio of a received magnetic resonance signal.

In some embodiments, the one or more flexible coil units (e.g., the flexible conductive wire) may include a transmission section for tuning. For example, as shown in FIG. 4, the single flexible coil unit 412 includes a transmission section 411 for tuning. In some embodiments, the transmission section 411 may be a section within the flexible conductive wire. The flexible coil unit 412 may include one or more transmission sections 411. In some embodiments, the one or more transmission sections 411 may, through its design of connection, simultaneously accommodate and release charge while receiving the magnetic resonance signal. In other words, the one or more transmission sections within the flexible conductive wire may be equivalent to a component like an inductor or a capacitor, allowing a resonance frequency of the radiofrequency coil to be close to a frequency of the magnetic resonance signal, thereby achieving tuning of the radiofrequency coil.

In some embodiments, the one or more flexible coil units (e.g., the flexible conductive wire) may include a core wire and a ground wire, and each of the one or more transmission sections 411 may include at least one of a first transmission section 411-1 used to be equivalent to capacitance or a second transmission section 411-2 used to be equivalent to inductance. In the first transmission section 411-1, the core wire is connected, while the ground wire is disconnected, and in the second transmission section 411-2, the core wire is disconnected while the ground wire is connected.

In some embodiments, the core wire may be a wire used for transmitting electric power, and the ground wire may be a wire with a zero ground potential. As shown in FIG. 4, an output end of the transmission section 411 may be connected to the transmission line 420 for outputting the received magnetic resonance signal. The transmission section 411 may accommodate and release charge through connecting and disconnecting of the core wire and the ground wire. For example, when the core wire in the first transmission section 411-1 is connected, and the ground wire in the first transmission section 411-1 is disconnected, the first transmission section 411-1 allows alternating current (e.g., AC voltage or current) to pass while blocking direct current (e.g., DC voltage or current), functioning equivalent to a capacitor. When the core wire in the second transmission section 411-2 is disconnected, and the ground wire in the second transmission section 411-2 is connected, the second transmission section 411-2 allows direct current to pass while blocking alternating current, functioning equivalent to an inductor. In some embodiments, the flexible conductive wire may include a coaxial wire, a microstrip wire, a twisted pair wire, or other composite flexible conductive wires (e.g., the core wire and the ground wire) with a plurality of conductors.

In some embodiments, the ground wire may be disposed on an outer side of the core wire. In some embodiments, the core wire may pass through a surface of the ground wire to adjust a length of the first transmission section. In some embodiments, the series-connected first transmission sections 411-1 and second transmission sections 411-2 in the flexible conductive wire are equivalent to a series connection of the capacitor and the inductor, making the flexible conductive wire in the at least one coil portion 410 equivalent to an LC series resonant circuit. In some embodiments, a resonant frequency of the at least one coil portion 410 may be controlled by changing counts and/or positions of the first transmission section 411-1 and the second transmission section 411-2. In some embodiments, a dielectric material may be disposed between the ground wire and the core wire to match and achieve resonance in the flexible conductive wire.

In the conventional radiofrequency coil array soldered on the PCB board, the conductor in the PCB board may generate an induced current in an imaging region due to varying currents, and in a severe case, may generate an eddy current affecting imaging quality of the imaging region. The radiofrequency coil provided in the present disclosure adopts a design with the composite flexible conductive wire (e.g., the coaxial wire, the microstrip wire, or the twisted pair wire) and achieve electromagnetic isolation by wrapping the ground wire around the core wire. This design can reduce the possibility of the eddy current, thus enhancing the imaging quality. Additionally, a reduction in eddy current intensity can also reduce an impact on a gradient coil magnetic field. Moreover, replacing a rigid discrete radiofrequency resonant circuit in the circuit of the conventional radiofrequency coil with a flexible transmission line resonant circuit can enhance the flexibility of the radiofrequency coil, making the radiofrequency coil more pliable and better suited to the target scanning region, thereby improving the imaging quality. The absence of the rigid components reduces an overall thickness of the radiofrequency coil and prevents a localized protrusion on the surface, maximizing space savings.

In some embodiments, the transmission line 420 may include a core wire and a ground wire. In some embodiments, the transmission line 420 may include a coaxial wire, a microstrip wire, a twisted pair wire, or other composite flexible conductive wires (e.g., the core wire and the ground wire) with a plurality of conductors. In some embodiments, the transmission line 420 and the transmission section 411 in the one or more flexible coil units 412 may use a same type of conductor. As shown in FIG. 4, both the transmission line 420 and the transmission section 411 may use the coaxial wire. In some embodiments, the transmission line 420 and the transmission section 411 may use different types of conductors. For example, the transmission line 420 uses the coaxial wire, while the transmission section 411 uses the microstrip wire.

In some embodiments, there are various ways to connect the one or more flexible coil units to the transmission line. In some embodiments, the core wire at the output end of the one or more flexible coil units may be connected to the core wire of the transmission line; the ground wire at the output end of the one or more flexible coil units may be connected to the ground wire of the transmission line, or, the ground wire of the flexible coil unit and the ground wire of the transmission line may both be connected to ground. In some embodiments, the ground wire at an end away from the output end of the one or more flexible coil units may be connected to ground or connected to the ground wire of the transmission line.

In some embodiments, the impedance matching may be achieved by designing a physical property (e.g., a length, a thickness, etc.) of the transmission line to provide a characteristic impedance, wherein an impedance of the flexible coil unit serves as an input impedance, while a load (e.g., the preamplifier 430, a radiofrequency component, etc.) serves as an output impedance. If both the input and output impedances are complex numbers, the impedance matching may be achieved when real parts of the input impedance and the output impedance are equal, and imaginary parts of the input impedance and the output impedance are opposite. For example, impedance matching between the input impedance of the one or more flexible coil units 412 and the output impedance of the preamplifier 430 may be achieved when real parts of the one or more flexible coil units 412 and the preamplifier 430 are equal, and imaginary parts of the one or more flexible coil units 412 and the preamplifier 430 are opposite.

In some embodiments, the length of the transmission line 420 may be determined based on a wavelength of the magnetic resonance signal to achieve the impedance matching. The length of the transmission line 420 may be an electrical length of the transmission line 420 for signal transmission. In some embodiments, the length of the transmission line 420 may be an odd multiple of one-quarter of a wavelength of a signal (e.g., the magnetic resonance signal) transmitted in the transmission line 420.

In some embodiments, the radiofrequency coil 400 also includes a channel selection controller (e.g., a channel selection controller 3500) that is connected to the one or more flexible coil units 412. The channel selection controller is used to implement channel selection for the one or more flexible coil units 412.

In some application scenarios, when a user uses and bend the radiofrequency coil, there may be a case where there is an excessive count of overlapping regions of two flexible coil units within the radiofrequency coil, which may affect the image quality subsequently. Since the one or more flexible coil units are located within the one or more flexible protective layers, the user may find it difficult to detect the overlapping region of the one or more flexible coil units while bending the radiofrequency coil. The channel selection controller may stop receiving channel data corresponding to one of the two flexible coil units when there is the excessive count of overlapping regions of the two flexible coil units within the radiofrequency coil 400, thereby improving the imaging quality. For more details on channel selection, please refer to FIGS. 22 to 28 and related descriptions.

Figure 5:
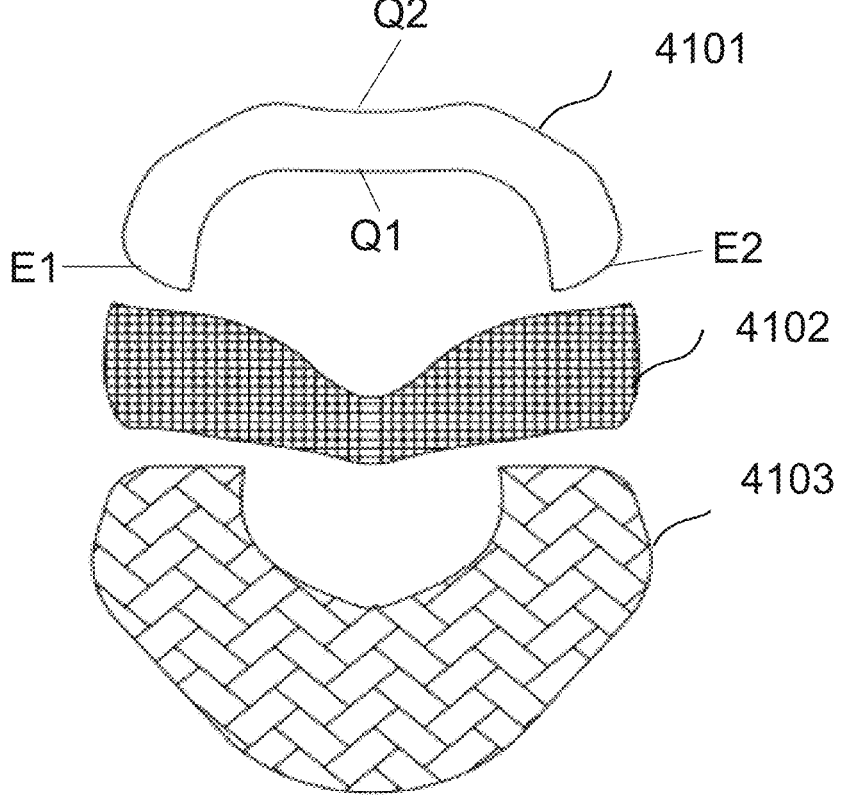
FIG. 5 is a schematic diagram of a flat structure of exemplary coil portions according to some embodiments of the present disclosure.
Figure 6:
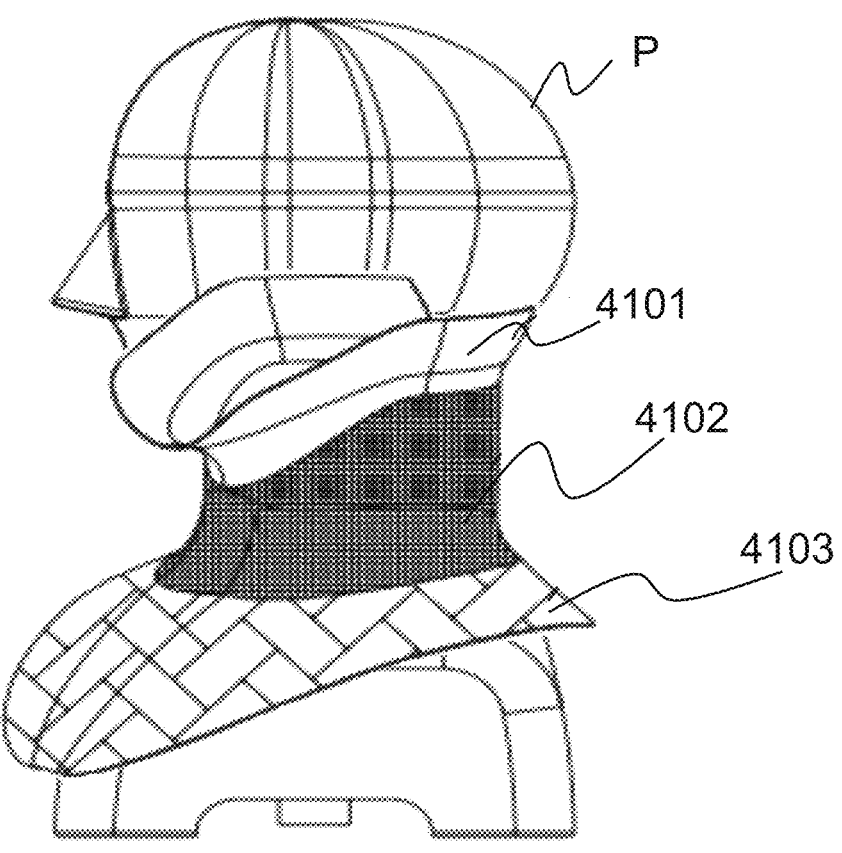
FIG. 6 is a schematic diagram of a three-dimensional structure of the exemplary coil portions according to some embodiments of the present disclosure.

Building on the previous text, in some embodiments, the at least one coil portion is capable of covering at least a jaw region of an object and a neck region of the object. FIG. 5 is a schematic diagram of a flat structure of exemplary coil portions according to some embodiments of the present disclosure. As shown in FIG. 5, in some embodiments, the radiofrequency coil 400 may include three coil portions: 4101, 4102, and 4103. FIG. 6 is a schematic diagram of a three-dimensional structure of the exemplary coil portions according to some embodiments of the present disclosure. When combined, the coil portions 4101, 4102, and 4103 form the three-dimensional structure capable of encasing at least the jaw region and the neck region of the object. FIG. 7(*a*) is a schematic diagram of a side view of an exemplary coil portion according to some embodiments of the present disclosure, and FIG. 7(*b*) is a schematic diagram of a front view of the exemplary coil portion according to some embodiments of the present disclosure. As shown in FIG. 7(*a*) and FIG. 7(*b*), the radiofrequency coil 400 may include the one coil portion 410. The coil portion 410 may form a hyperbolic surface structure, capable of encasing at least the jaw region and the neck region of the object.

In some embodiments, the at least one coil portion (e.g., the coil portions 4101, 4102, and 4103) included in the radiofrequency coil (e.g., the radiofrequency coil 400) may be a separable structure. In some embodiments, the at least one coil portion may be detachably or fixedly connected, wherein a connection manner may include a fixed connection manner, for example, through stitching, gluing, etc., or a detachable connection manner, for example, through a Velcro, a strap, a button, a zipper, etc. When the at least one coil portion is fixedly connected, the at least one coil portion forms an integral part of the radiofrequency coil. Optionally, when the at least one coil portion is detachably connected, the at least one coil portion may have at least two opposite free ends, and the at least two opposite free ends may be detachably connected to form the three-dimensional structure for each of the at least one coil portion.

Combining FIGS. 5 and 6, as shown in FIG. 5, the coil portions 4101, 4102, and 4103 are separable structures. The user (e.g., medical personnel, the object, etc.) may respectively bend the coil portion 4101, the coil portion 4102, and the coil portion 4103, and then stitch the bent coil portion 4101, the bent coil portion 4102, and the bent coil portion 4103 to form the three-dimensional structures shown in FIG. 6. The medical personnel may then cover the formed three-dimensional structures around a target scanning region of the object and connect the at least two opposite free ends of each coil portion to scan the target scanning region. The at least two free ends (e.g., E1 and E2 in FIG. 5) may be detachably connected through the Velcro, the strap, the button, the zipper, etc., and the present disclosure does not impose restrictions.

By configuring each of the at least one coil portion as the separable structure with the at least two opposite free ends, and allowing the at least two opposite free ends to be detachably connected, the user may bend the at least one coil portion as needed and then stitch the at least one coil portion to form the three-dimensional structure that match a complex scanning region, thereby enhancing convenience and flexibility of using the radiofrequency coil.

In some embodiments, the at least one coil portion may form the hyperbolic surface structure. For example, as shown in FIG. 7(*a*), the coil portion 410 may form the hyperbolic surface structure through an opening structure S on a flexible protective layer 1301 of the at least one coil portion 410. In some embodiments, the at least one coil portion may include a first array (e.g., the coil portion 4101) and a second array (e.g., the coil portion 4103), the first array may be configured to be disposed about a first part of the object with a first curvature, and the second array may be configured to be disposed about a second part of the object with a second curvature. For example, as shown in FIG. 6, the coil portion 4101 can be disposed about a jaw region of the object P with a first curvature, and the coil portion 4103 can be disposed about a root of neck region of the object P with a second curvature. The curvature of the coil portion may reflect a degree of the bending of the coil portion (e.g., the coil portion 4101, the coil portion 4102, or the coil portion 4103). The curvature of the coil portion may be represented by the degree of the bending of an edge connecting two free ends of the coil portion. For example, as shown in FIG. 5, the curvature of the coil portion 4101 may be represented by the degree of the bending of the edge Q1 and/or Q2 connecting free ends E1 and E2. In some embodiments, the degree of the bending of the edge may be represented by the average curvature of the edge. The average curvature of the edge refers to a ratio of an angle variation of the edge to the length of the edge. The angle variation of the edge may be represented by an angle between two tangent lines at two endpoints of the edge. It is to be noted that, when a coil portion is in a flat state, curvatures of different edges of the coil portion (e.g., the flexible protective layer) may also be different. For example, as shown in FIG. 5, the two free ends E1 and E2 of the coil portion 4101 have a larger curvature compared to the edge Q1. In some embodiments, when the first array is disposed about the first part of the object with the first curvature and the second array is disposed about the second part of the object with the second curvature, the first array is connected with the second array by a transition part (e.g., the coil portion 4102) to form a three-dimensional structure matching a target scanning region of the object, and a curvature of the transition part is greater than the first curvature and the second curvature. For example, as shown in FIG. 6, the coil portion 4101 is disposed about the jaw region of the object P with the first curvature, the second array is disposed about the root of neck region of the object P with the second curvature, the coil portion 4101 is connected with the coil portion 4103 by the coil portion 4102, the degree of the bending of the coil portion 4102 around the object P is greater than the coil portion 4101 and the coil portion 4103, and the coil portions 4101, 4102 and 4103 form the hyperbolic surface structure and may cover the jaw region and the neck region of the object.

In some embodiments, the curvatures of the at least one coil portion (e.g., the flexible protective layer) may be determined by attaching the at least one coil portion to a model of the target scanning region (e.g., the jaw region and the neck region) of the object and using a simulation calculation or a three-dimensional cutting approach. In some embodiments, the curvatures of the at least one coil portion may be determined through statistical analysis or a machine learning model, and the present disclosure does not impose any specific restrictions.

As seen from FIGS. 5 to 9, the at least one coil portion of the radiofrequency coil in the embodiment may be bent in at least two different directions. Furthermore, as each of the at least one coil portion may have a different curvature, the bent radiofrequency coil may better conform to the complex scanning region of the object.

Building on the previous text, in some embodiments, the at least one coil portion also includes one or more flexible protective layers, and the one or more flexible coil units are disposed on the one or more flexible protective layers. Since the one or more flexible coil units are formed by the flexible conducting wire, it means that the flexible conducting wire is disposed on the one or more flexible protective layers.

Figure 8:
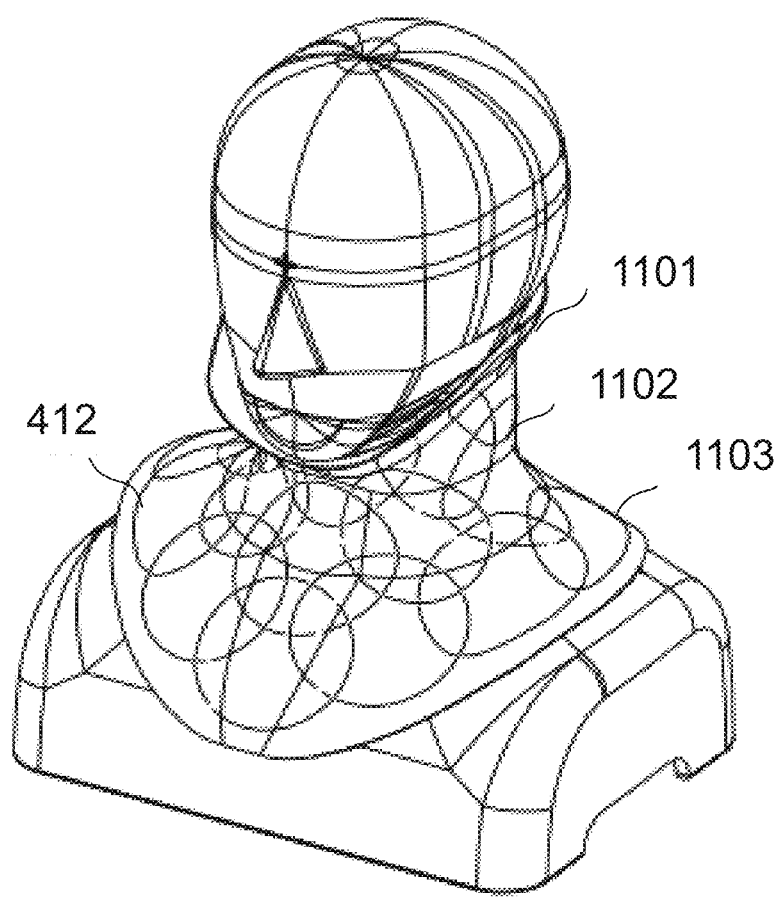
FIG. 8 is a schematic diagram of a structure of exemplary coil portions according to some embodiments of the present disclosure.
Figure 9:
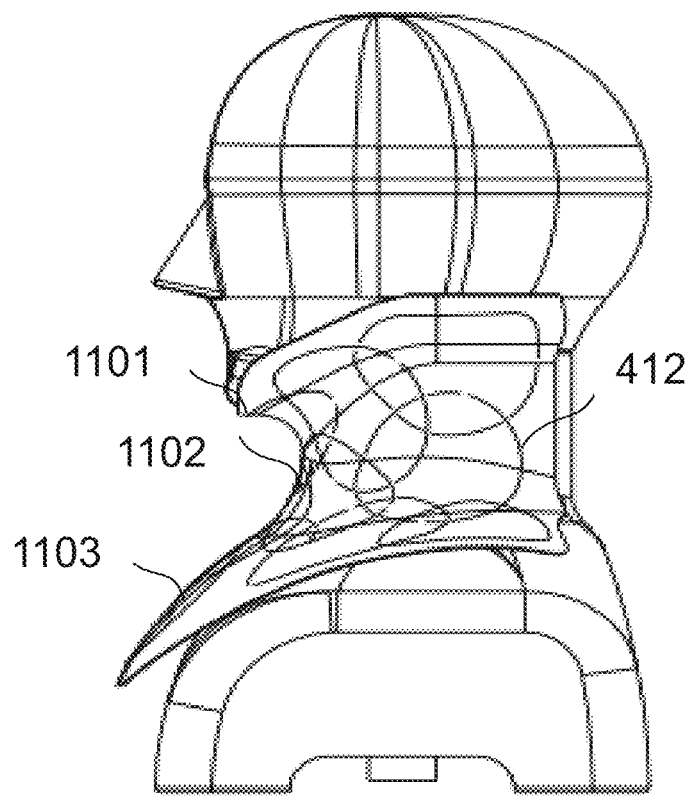
FIG. 9 is a schematic diagram of a structure of exemplary coil portions according to some other embodiments of the present disclosure.

FIG. 8 is a schematic diagram of a structure of exemplary coil portions according to some embodiments of the present disclosure, and FIG. 9 is a schematic diagram of a structure of exemplary coil portions according to some other embodiments of the present disclosure. As shown in FIGS. 8 and 9, taking the radiofrequency coil including three coil portions as an example, the radiofrequency coil 400 may include the flexible coil units 412 (i.e., circles in FIGS. 8 and 9) and flexible protective layers 1101, 1102, and 1103. Each of the flexible protective layers may form a respective coil portion with a corresponding flexible coil unit. For example, the flexible protective layer 1101 and the flexible coil units 412 disposed on the flexible protective layer 1101 may form the coil portion 4101, the flexible protective layer 1102 and the flexible coil units 412 disposed on the flexible protective layer 1102 may form the coil portion 4102, and the flexible protective layer 1103 and the flexible coil unit 412s disposed on the flexible protective layer 1103 may form the coil portion 4103.

Figure 7A:
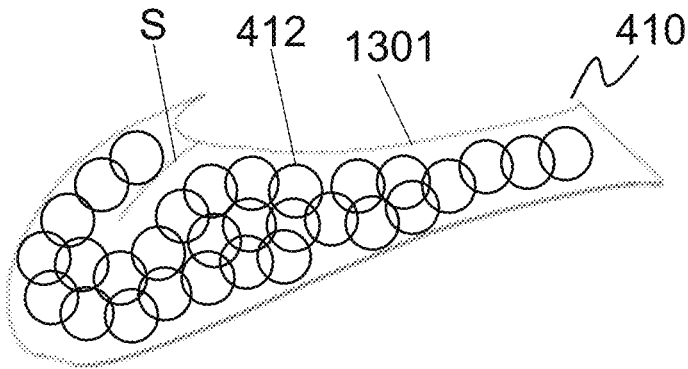
FIG. 7($a$) is a schematic diagram of a side view of an exemplary coil portion according to some embodiments of the present disclosure.
Figure 7B:
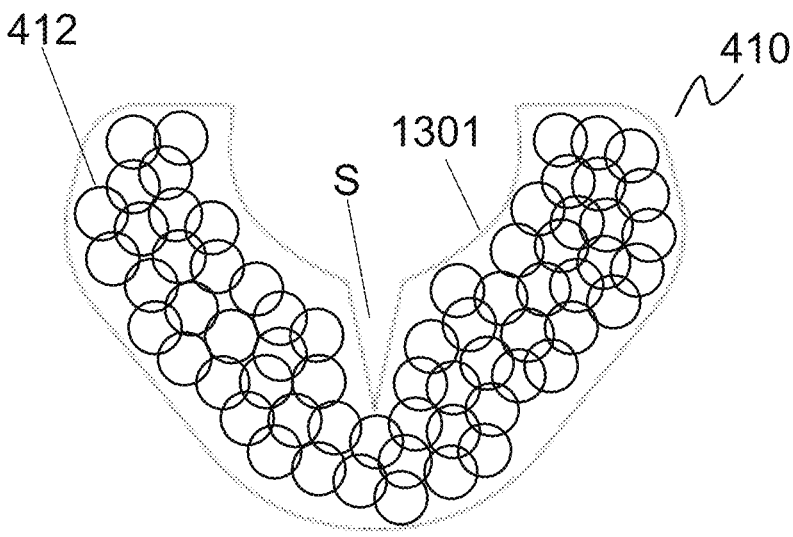

In some embodiments, the at least one coil portion may include one flexible protective layer with an opening structure, and the one or more flexible coil units formed by the flexible conducting wire are disposed on the flexible protective layer with the opening structure. For example, as shown in FIG. 7(a) or FIG. 7(b), the coil portion 410 may include the flexible protective layer 1301 with the opening structure S, and the flexible coil units 412 are disposed on the flexible protective layer 1301. In FIG. 7(b), the opening structure S of the flexible protective layer is in an open state, and in FIG. 7(a), the opening structure S of the flexible protective layer is in a closed state. When the opening structure S is closed, the coil portion 410 forms the hyperbolic surface structure and may cover the jaw region and the neck region of the object.

In some embodiments, for the radiofrequency coil to better detect a cervical vertebra region, optionally, each of the one or more flexible protective layers may cover at least the jaw region or the neck region of the object respectively. For example, as shown in FIG. 6, the flexible protective layer corresponding to the coil portion 4101 may cover the jaw region of the object, and the flexible protective layers corresponding to the coil portion 4102 and the coil portion 4103 may cover the neck region of the object. In this embodiment, the each of the flexible protective layers may cover at least the jaw region and the neck region of the object respectively, thereby allowing the radiofrequency coil to be used for a complex scanning region, such as the cervical vertebra, and expanding a range of use of the radiofrequency coil.

In some embodiments, to improve stability and practicality of the flexible protective layers, optionally, each of the one or more protective layers may be a multi-layer structure. For example, the flexible protective layer 1101 may include a waterproof layer, a filtering layer, and a basic spun fabric layer. Understandably, materials and counts of the multi-layer structures may differ between the one or more flexible protective layers. As shown in FIG. 6, a stiff lining fabric may be used in the one or more flexible protective layers to provide support for an upper collar region. Of course, various combinations of different shapes and materials may achieve different structural forms to optimize the covering of specific scanning regions. The present disclosure does not impose specific limitations on such variations.

In some embodiments, the one or more flexible protective layers may include a mounting layer and a covering layer. The one or more flexible coil units are disposed between the mounting layer and the covering layer. In some embodiments, the mounting layer and the covering layer may include one or more flexible materials of a leather (e.g., a polyurethane leather), a felt, a fabric (e.g., a polyester fabric, a non-woven fabric, etc.), etc. For example, the covering layer may use a PU leather, which offers advantages of being lightweight, aging-resistant, wear-resistant, snug, and non-imaging.

In some embodiments, the mounting layer may include an intermediate layer and a filling layer, and the one or more flexible coil units are disposed on the intermediate layer. In some embodiments, the intermediate layer may use a soft fabric like the non-woven fabric to allow the radiofrequency coil to be applicable to a scanning region that require bending and deformation. In some embodiments, the intermediate layer may use the stiffer lining fabric for shaping the at least one coil portion. In some embodiments, the filling layer may use a material like the felt to enhance performance of the radiofrequency coil in fire resistance, heat insulation, comfort, etc.

In some embodiments, the covering layer may include a hollow structure along a thickness direction of the covering layer, and the one or more flexible coil units are disposed in the hollow structure.

In the embodiments described in the present disclosure, the covering layer may form an outermost layer covering a coil component (e.g., the one or more flexible coil units). The hollow structure is formed on the mounting layer and the covering layer, facilitating heat dissipation of the radiofrequency coil during use. Furthermore, by having the hollow structure on the mounting layer and the covering layer, an additional rigid component is not required to secure the one or more flexible coil units spatially. This ensures ventilation and flexibility of the radiofrequency coil and enables the radiofrequency coil to better conform to the human tissue.

In some embodiments, the mounting layer and the covering layer of the one or more flexible protective layers may be connected by means of internal stitching and/or external stitching. In some embodiments, the mounting layer may be connected by means of the external stitching, and the covering layer may be connected by means of the internal stitching. In some embodiments, the filling layer within the mounting layer may be connected by means of the external stitching or the internal stitching, while the intermediate layer may be connected by means of the internal stitching.

Figure 10A:
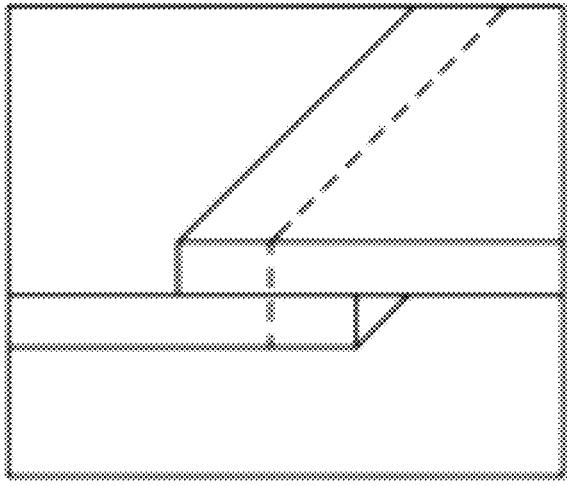
FIG. 10($a$) is a schematic diagram of an exemplary external stitching according to some embodiments of the present disclosure.
Figure 10B:
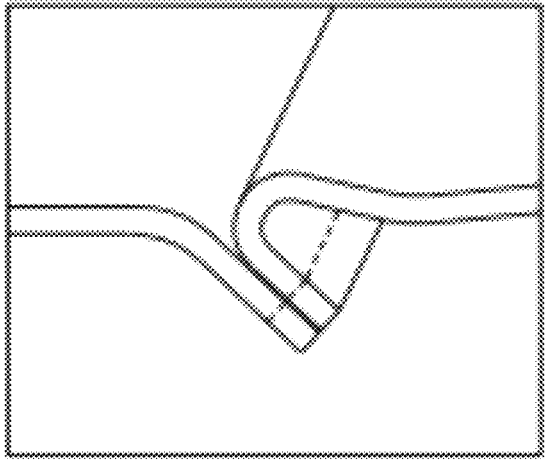

FIG. 10(a) is a schematic diagram of an exemplary external stitching according to some embodiments of the present disclosure, and FIG. 10(b) is a schematic diagram of an exemplary internal stitching according to some embodiments of the present disclosure. Because the intermediate layer is used to support the one or more flexible coil units, i.e., the one or more flexible coil units are attached to the intermediate layer, in order to ensure smoothness of the intermediate layer at joints, thus indirectly ensuring that a position and a dimension of the one or more flexible coil units are not affected by the joining of various layers of the one or more flexible protective layers, as shown in FIG. 10(*a*), the intermediate layer may be secured to the one or more flexible coil units by means of the external stitching through a hole or a seam line, i.e., the intermediate layers of the one or more flexible coil units are connected by means of the external stitching. To ensure the aesthetics and the smoothness of the one or more flexible protective layers, outermost covering layers of each of the one or more flexible protective layers is connected by means of the internal stitching, as shown in FIG. 10(*b*), to hide a stitching line inside.

By connecting the outermost layers (e.g., the covering layer) of each of the one or more flexible protective layers by means of the internal stitching and connecting innermost layers (e.g., the intermediate layer) of each of the one or more flexible protective layers by means of the external stitching, the radiofrequency coil becomes smoother and more reliable.

In some embodiments, the radiofrequency coil (e.g., the radiofrequency coil 400) may also include a circular sealing edge structure. The sealing edge structure is disposed along an edge of the hollow structure. In some embodiments, the sealing edge structure may include a sealing part, an adhesive region, and a stitching part. The adhesive region surrounds outside the edge of the hollow structure and bonds the covering layer and the mounting layer. The sealing part is disposed along an inner edge of the adhesive region and is in sealing connection with the covering layer and the mounting layer. The stitching part is disposed along an outer edge of the adhesive region and stitches the covering layer and the mounting layer.

In some embodiments, the adhesive region may be understood as a region where the mounting layer and covering layer are bonded in a circular region. The adhesive region is used to bond the mounting layer and the covering layer at a gap in the hollow structure. Additionally, the adhesive region provides a relatively smooth operation region for a subsequent process (e.g., a stitching operation, a sealing operation, etc., which are to be explained below).

In some embodiments, the sealing part is disposed along the inner edge of the adhesive region and in sealing connection with the covering layer and the mounting layer. The sealing part refers to a structure that may seal a gap between the mounting layer and the covering layer at a location of the hollow structure. Through the sealing connection of the sealing part with the covering layer and the mounting layer, the sealing part may fully seal the gap at the location of the hollow structure and further secure the connection of the mounting layer and covering layer on the inner edge of the adhesive region, ensuring stability of the adhesive region.

In some embodiments, the stitching part may be disposed along the outer edge of the adhesive region, stitching the covering layer and the mounting layer. The stitching part may be understood as a structure formed by stitching the mounting layer and covering layer together along the outer edge of the adhesive region, effectively providing further reinforcement of the connection between the covering layer and mounting layer. Additionally, because the radiofrequency coil may be frequently bent during use, adhesive strength and structural integrity of the adhesive region alone may be insufficient. A stitched thread of the stitching part disposed along the outer edge of the adhesive region may serve to share a force generated by stretching of the covering layer during the bending of the radiofrequency coil, thereby increasing the adhesive strength and structural integrity of the adhesive region, ensuring the stability of the adhesive region.

In the embodiments of the present disclosure, even with the presence of the hollow structure, the sealing edge structure is disposed to, on one hand, enhance the structural strength of the radiofrequency coil, and on the other hand, seal the mounting layer and covering layer at the location of the hollow structure, effectively isolating the covering layer from an external environment, thus allowing the covering layer to work safely and securely. Additionally, by employing sealing, adhesive, and stitching processes in the sealing edge structure, the covering layer and mounting layer may form a smooth and seamless whole, ensuring the structural integrity of the hollowed flexible coil unit within the radiofrequency coil. Furthermore, the sealing edge structure may a surface of the radiofrequency coil locally smooth and concave, reducing unnecessary contact area with the human tissue, improving heat dissipation, and enhancing wearing comfort of the radiofrequency coil. Therefore, the radiofrequency coil described in the present disclosure can offer excellent heat dissipation performance, high structural strength, and safe operation.

In some embodiments, at least one coil portion may include at least two flexible protective layers, and sizes and/or counts of the one or more flexible coil units on the at least two flexible protective layers are different.

The sizes of the one or more flexible coil units within the one or more flexible protective layers may affect a scanning depth. For example, the larger diameters of the flexible coil units 412 in FIG. 8, the deeper the scanning depth corresponding to the flexible coil units 412. During the scanning of the object using the radiofrequency coil, different target scanning regions may have different scanning requirements. Taking the cervical spine as an example, when scanning a thyroid region of the object, a deeper scanning depth is required, whereas when scanning an arterial region of the object, a shallower scanning depth is required. In some embodiments, the sizes of the one or more flexible coil units corresponding to different flexible protective layers may be determined based on a depth requirement of the scanning region. For example, the deeper a required scanning depth, the larger a radius of the one or more flexible coil units. In some embodiments, the counts of the one or more flexible coil units may be determined based on the sizes of the one or more flexible coil units in the corresponding flexible protective layer and/or the depth requirement of the scanning region. For example, the larger the radius of the one or more flexible coil units corresponding to a flexible protective layer, the smaller the count of the one or more flexible coil units within the protective layer.

For example, as shown in FIG. 8, a diameter of a flexible coil unit in the flexible protective layer 1101 is denoted as a, a diameter of a flexible coil unit in the flexible protective layer 1102 is denoted as b, and a diameter of a flexible coil unit in the flexible protective layer 1103 is denoted as c, where a<b<c, and a, b, and c are all constants greater than zero. By way of example, values of a, b, and c may be 50 mm, 70 mm, 100 mm, or 40 mm, 60 mm, 90 mm, or 60 mm, 80 mm, 110 mm, or 55 mm, 75 mm, 105 mm, or 42 mm, 62 mm, 92 mm, etc., respectively.

In a conventional radiofrequency coil (e.g., the radiofrequency coil shown in FIG. 2 or FIG. 3), sizes of coil units within the radiofrequency coil is often uniform and fixed. Furthermore, due to variability and complexity of scanning regions in the object, even if different regions within the conventional radiofrequency coil may have coil units of different sizes, medical personnel still find it challenging to fully match the coil units to different scanning regions when using the conventional radiofrequency coil. In this embodiment, the sizes and/or counts of the one or more flexible coil units on the at least two flexible protective layers of the at least one coil portion are different, allowing changes in scanning depth through the sizes and/or counts of the one or more flexible coil units. This extends the applicability of the radiofrequency coil (e.g., the radiofrequency coil 400) to different scanning regions, reducing the complexity and time involved for the medical personnel during operation.

It should be noted that FIGS. 5 to 9 illustrate the application of the radiofrequency coil to the neck region of the object as an example, but the radiofrequency coil 400 provided in this embodiment may also be applied to other complex scanning regions of the object, for example, the knees, head, ankles, etc.

It should be noted that the above description of the coil portions is for illustrative purposes only and does not intend to limit the scope of the present disclosure. Those skilled in the art may make various modifications and variations based on the present disclosure. However, such changes and modifications remain within the scope of the present disclosure.

FIG. 11 is a schematic diagram of an exemplary process for preparing at least one coil portion according to some embodiments of the present disclosure. In some embodiments, the coil portions illustrated in FIGS. 5 to 9 may be prepared using the following process, as shown in FIG. 11:

In step 1710, obtaining at least one flexible protective layer by means of cutting.

In some embodiments, the at least one flexible protective layer is a flexible and deformable material. In some embodiments, the at least one flexible protective layer is a separable structure (as shown in FIG. 5). In some embodiments, the at least one flexible protective layer is provided with the opening structure (as shown in FIG. 7(*a*) and FIG. 7(*b*)).

Taking an example of obtaining a radiofrequency coil for covering the cervical vertebrae, the flexible and deformable material to be cut may be adhered to a pre-prepared cervical vertebrae model. Then, based on structural characteristics of various regions (e.g., the neck region, a chin region) of the cervical vertebrae model, the flexible and deformable material is segmented to obtain at least one cut flexible protective layer. For example, as shown in FIG. 8, the cutting process may yield flexible protective layers 1101, 1102, and 1103, each with different curvatures. Furthermore, as shown in FIG. 7(*a*) or FIG. 7(*b*), the cutting process may produce a single flexible protective layer 1301 as shown in the figures, with the opening structure on the flexible protective layer 1301.

In step 1720, disposing one or more flexible coil units on the at least one flexible protective layer.

In some embodiments, after obtaining the at least one flexible protective layer, the one or more flexible coil units may be disposed on the at least one flexible protective layer. That is, forming a flexible conductive wire into a circular shape and then placing the circular flexible conductive wire on the at least one flexible protective layer. For example, the one or more flexible coil units formed by the flexible conductive wire may be stitched onto the flexible protective layer 1101, the flexible protective layer 1102, and the flexible protective layer 1103 as shown in FIG. 8. As another example, the one or more flexible coil units formed by the flexible conductive wire may be securely attached to the flexible protective layer 1301, as shown in FIG. 7(*a*) or FIG. 7(*b*), using glue or other connecting media. In some embodiments, the one or more flexible coil units may be disposed on the at least one flexible protective layer by threading through a hole in the at least one flexible protective layer. In some embodiments, a corresponding count of the one or more flexible coil units may be disposed on the at least one flexible protective layer based on a determined size and count of the one or more flexible coil units associated with each flexible protective layer. The present disclosure does not place any limitations on the specific manner of disposing the one or more flexible coil units on the at least one flexible protective layer.

In step 1730, transforming each of the at least one flexible protective layer disposed with the one or more flexible coil units into a three-dimensional structure.

In some embodiments, each of the at least one flexible protective layer disposed with the one or more flexible coil units may be transformed into a corresponding three-dimensional structure (e.g., a three-dimensional structure corresponding to the neck region, a three-dimensional structure corresponding to a shoulder region, a three-dimensional structure corresponding to a leg region, etc.) before using the radiofrequency coil for a MRI scan or during a MRI scan process. As an example, consider the neck region, as shown in FIG. 11. For each of the coil portion 4101, the coil portion 4102, and the coil portion 4103, as shown in the figure, a user may hold two opposite free ends (e.g., the opposite free ends E1 and E2 of the flexible protective layer corresponding to coil portion 4101) of a corresponding flexible protective layer to bend or deform the corresponding flexible protective layer to shape each of the coil portions into the three-dimensional structure as shown in FIG. 6.

In step 1740, joining two adjacent three-dimensional structures to form the at least one coil portion.

In some embodiments, the two adjacent three-dimensional structures may be securely joined through stitching, gluing, etc., or detachably joined through a Velcro, a strap, a button, a zipper, etc., thus creating the at least one coil portion, as shown in FIG. 8 or FIG. 9.

In some embodiments, the at least one flexible protective layer with the opening structure, which have the one or more flexible coil units, may be transformed into a hyperbolic surface structure to create the at least one coil portion. For example, as shown in FIG. 7(*b*), the flexible protective layer 1301 with the flexible coil units 412 and the opening structure S, may be deformed into the hyperbolic surface structure illustrated in FIG. 7(*a*), forming the coil portion 410.

The at least one coil portion provided in this embodiment may be bent in a plurality of directions and the structures formed after the bending may match a complex scanning region (e.g., the neck, the ankles), thereby expanding an application range of the radiofrequency coil.

Building on the previous text, in some embodiments, when the radiofrequency coil 400 includes at least two coil portions, at least one of the at least two coil portions may bend in at least two directions, and a structure formed by the bending of the at least one of the at least two coil portions matches the target scanning region of the object.

FIG. 12 is a schematic diagram of structures of exemplary coil portions according to some other embodiments of the present disclosure. For the sake of illustration, this figure assumes that the radiofrequency coil includes two coil portions, and at least one of the two coil portions may bend in at least two directions, and a structure formed by the bending of the at least one of the at least two coil portions matches a target scanning region of an object.

In some embodiments, as shown in FIG. 12, the radiofrequency coil 400 may include two coil portions, for example, a first coil portion 4105 and a second coil portion 4107. Both the first coil portion 4105 and the second coil portion 4107 include a flexible protective layer and flexible coil units. For example, the first coil portion 4105 may include a flexible protective layer 1801 and flexible coil units 1802, and the second coil portion 4107 may include a flexible protective layer 1803 and flexible coil units 1804. In some embodiments, at least one of the first coil portion 4105 or the second coil portion 4107 may bend in at least two directions, and the structure formed after the bending of the at least one of the first coil portion 4105 or the second coil portion 4107 matches the target scanning region of the object.

For example, referring to FIG. 12, when it is necessary to scan and image a complex region like the shoulders, ankles, or elbows of the object, medical personnel may bend the first coil portion 4105 and the second coil portion 4107, respectively, along horizontal midlines of the first coil portion 4105 and the second coil portion 4107 and then join the bent first coil portion 4105 and the bent second coil portion 4107 together to adapt to the target scanning region of the object.

In some embodiments, at least one of the at least two coil portions may be bent sequentially in different directions. For example, the medical personnel may bend the first coil portion 4105 along the horizontal midline of the first coil portion 4105 first, and then continue to bend the first coil portion 4105 in another direction (e.g., along a line perpendicular to the horizontal midline).

In some embodiments, shapes of the first coil portion and the second coil portion may be regular shapes like rounded rectangles, or irregular shapes. In conjunction with the previous information, the first coil portion and the second coil portion may be detachably or securely connected through a connecting medium, with no limitations set by this embodiment.

The conventional radiofrequency coil may only bend in one direction and, as a result, is only suitable for a cylindrical body part like the torso and limbs, limiting its usage. In this embodiment, the radiofrequency coil 400 includes at least two coil portions (e.g., the first coil portion 4105 and the second coil portion 4107), with at least one of the at least two coil portions being capable of bending in at least two directions. The structure formed after bending matches the target scanning region of the object. As a result, the radiofrequency coil can be used for complex regions of the object, expanding the range of usage of the radiofrequency coil for MRI.

Figure 13:
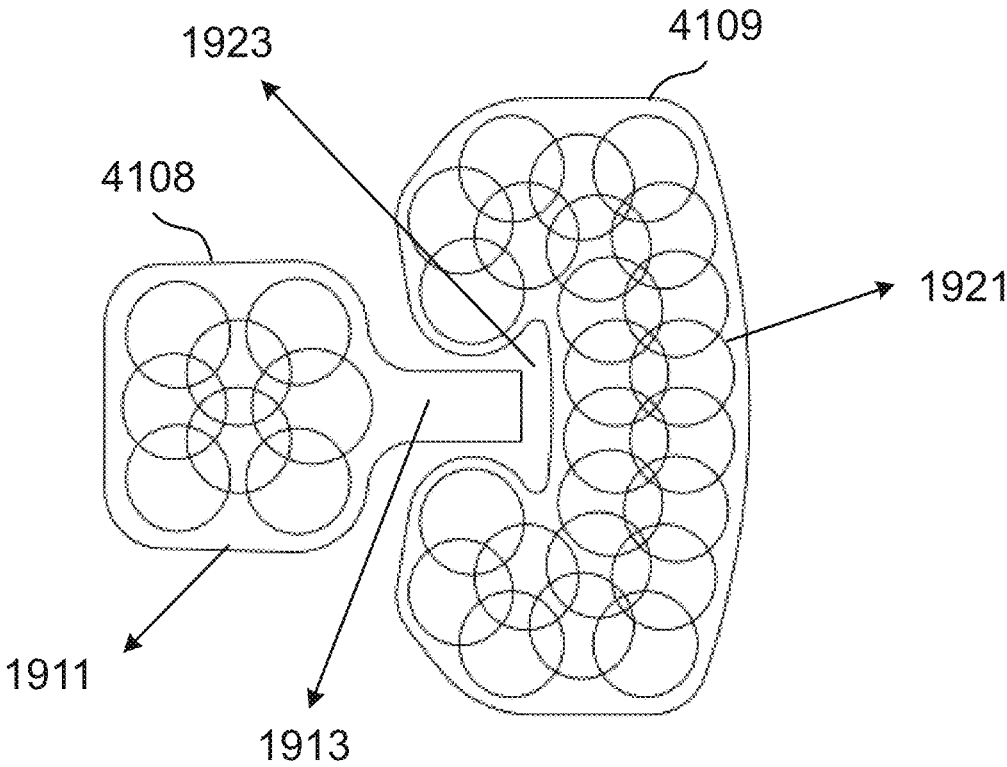
FIG. 13 is a schematic diagram of structures of exemplary coil portions according to some other embodiments of the present disclosure.

In some embodiments, to further ensure that the structure formed by the bending of the at least one of the at least two coil portions matches the target scanning region of the object, as shown in FIG. 13, the at least two coil portions of the radiofrequency coil 400 may include a first coil portion 4108 and a second coil portion 4109. The first coil portion 4108 may include a first main part 1911 and a first protrusion part 1913. The second coil portion 4109 may include a second main part 1921 and a first concave part 1923. The first protrusion 1913 may cooperate with the first concave part 1923 to join the first coil portion 4108 and the second coil portion 4109. In some embodiments, the first coil portion 4108 and the second coil portion 4109 may be joined by means of a Velcro, a strap, a stitch, a zipper, a button, etc., without any restrictions set by this embodiment. In some embodiments, the first coil portion 4108 may be located at the first concave part 1923 of the second coil portion 4109.

In some embodiments, the first protrusion 1913 may not be disposed with one or more flexible coil units.

In this embodiment, the first coil portion includes the first main part and the first protrusion part, and the second coil portion includes the second main part and the first concave part. The first protrusion part cooperates with the first concave part to join the first coil portion and the second coil portion, making the radiofrequency coil easier to carry and use, reducing operation time of the medical personnel, and improving MRI scanning efficiency.

In some embodiments, to ensure complete coverage of the scanning region, the first coil portion (e.g., the first coil portion 4105 or the first coil portion 4108) and the second coil portion (e.g., the second coil portion 4107 or the second coil portion 4109) may be joined by means of seamless joining, stacking joining, or overlapping joining. FIG. 14(*a*) is a schematic diagram of exemplary joining of coil portions according to some embodiments of the present disclosure, and FIG. 14(*b*) is a schematic diagram of exemplary joining of coil portions according to some other embodiments of the present disclosure. As shown in FIG. 14(*a*) and FIG. 14(*b*), the first protrusion 1913 of the first coil portion 4108 may be stitched to a right side (i.e., the right side of the drawing) of the second main part 1921 of the second coil portion 4109, achieving the seamless joining. The radiofrequency coil for MRI provided in this embodiment can comprehensively cover the target scanning region of the object, improving the accuracy of scanning and imaging.

In some embodiments, the second main part may include a first portion, a second portion, and a third portion, and the first concave part is formed with the second portion and the third portion located at two ends of the first portion, respectively. The first portion is configured to bend in a first direction, the second portion is configured to bend in a second direction, and the third portion is configured to bend in a third direction.

Figure 15:
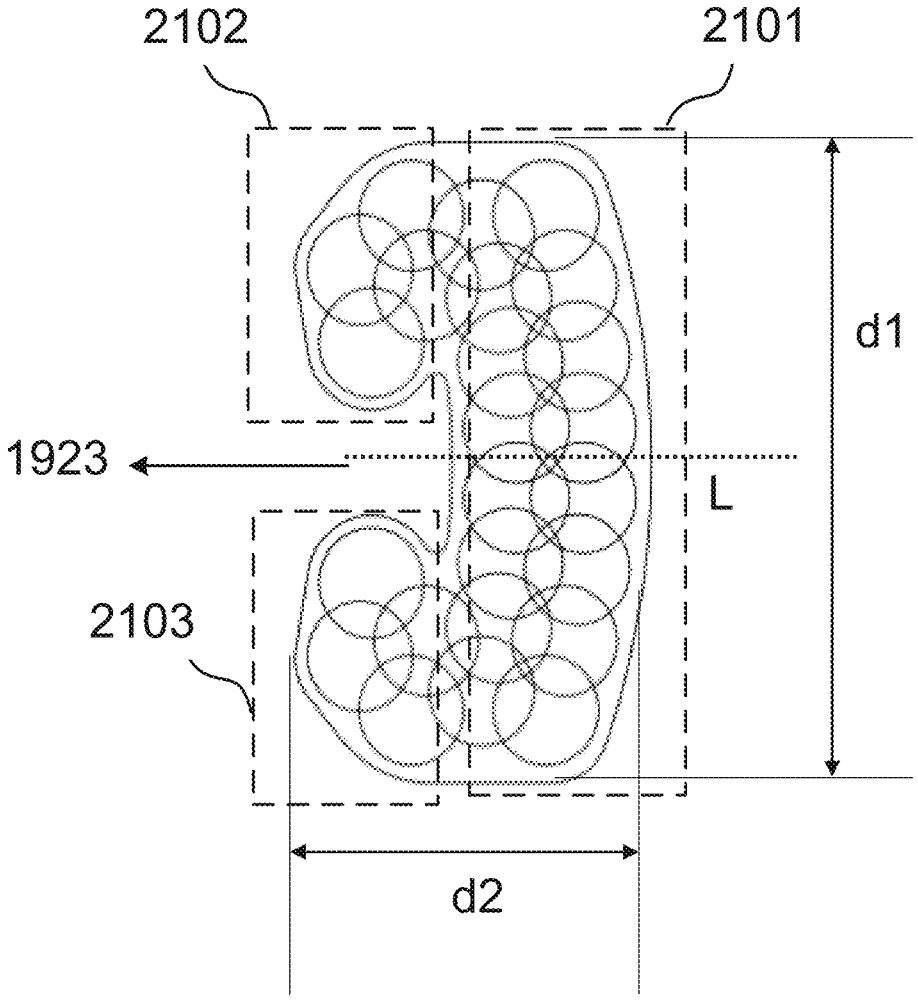
FIG. 15 is a schematic diagram of an exemplary structure of a second coil portion according to some embodiments of the present disclosure.

FIG. 15 is a schematic diagram of an exemplary structure of a second coil portion according to some embodiments of the present disclosure. As shown in FIG. 15, the second main part 1921 may include a first portion 2101, a second portion 2102, and a third portion 2103, and the first concave part 1923 is formed with the second portion 2102 and the third portion 2013 located at two ends of the first portion 2101, respectively. In some embodiments, the first portion 2101 may bend in a first direction, the second portion 2102 may bend in a second direction, and the third portion 2103 may bend in a third direction. It should be noted that the first direction, second direction, and third direction may be any direction in space, i.e., the first direction, second direction, and third direction may be the same or different.

Figure 16:
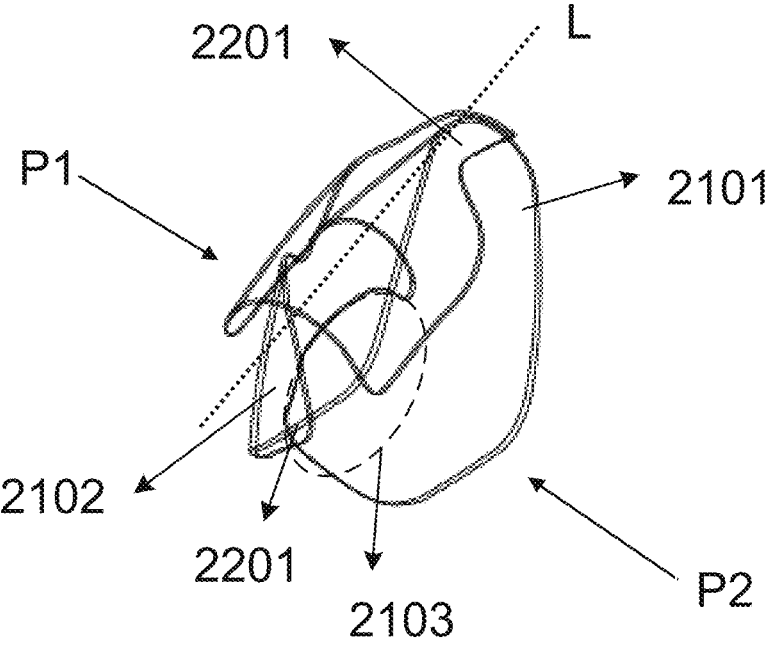
FIG. 16 is a schematic diagram of exemplary bending of coil portions according to some embodiments of the present disclosure.

FIG. 16 is a schematic diagram of exemplary bending of coil portions according to some embodiments of the present disclosure. FIG. 16 shows the first portion 2101 bending in a first direction, the second portion 2102 bending in a second direction, and the third portion 2103 bending in a third direction. As shown in FIG. 16, a user (e.g., medical personnel, an object, etc.) may bend the first portion 2101 downward along a horizontal midline (line L in FIG. 15 or FIG. 16) of the first portion 2101, and bend the second portion 2102 and the third portion 2103 along directions opposite to the second portion 2102 and the third portion 2103 respectively. For example, the second portion 2102 may be bent in a direction of the arrow P1, and the third portion 2103 may be bent in a direction of the arrow P2 to form the structure shown in FIG. 16.

In this embodiment, the second main part includes the first portion, the second portion, and the third portion, and the first concave part is formed with the second portion and the third portion located at two ends of the first portion, respectively. Because the first portion may bend in the first direction, the second portion may bend in the second direction, and the third portion may bend in the third direction, therefore the structure formed after the bending of the first portion, the second portion, and the third portion matches the complex target scanning region of the object.

In some embodiments, there is an overlapping region between the bent second portion and the bent third portion. As shown in FIG. 16, the bent second portion 2102 and the bent third portion 2103 have an overlapping region 2201. In some embodiments, the overlapping region may be connected by a connecting component. For example, the connecting component may be at least one of a Velcro, a strap, a connecting button, etc., that serves a connecting function. Based on this, the radiofrequency coil for MRI in this embodiment has some stability after bending, improving the convenience of using the MRI radiofrequency coil and facilitating subsequent scanning work.

Figure 17A:
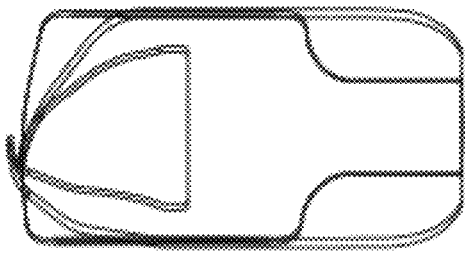
FIG. 17($a$) is a schematic diagram of a top view of exemplary bending of coil portions according to some embodiments of the present disclosure.
Figure 17B:
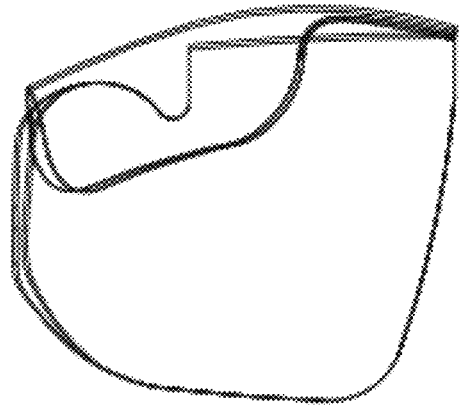

To provide a clearer explanation of the radiofrequency coil described in the present disclosure, the following description will be given in conjunction with FIG. 17(a), FIG. 17(b), FIG. 18(a) and FIG. 18(b). FIG. 17(a) is a schematic diagram of a top view of exemplary bending of coil portions according to some embodiments of the present disclosure, and FIG. 17(b) is a schematic diagram of a side view of exemplary bending of the coil portions according to some embodiments of the present disclosure. In some application scenarios, as shown in FIG. 16, and FIG. 17(a) and FIG. 17(b), a user may bend the first portion 2101 of the second coil portion 4109 downward along the horizontal centerline L of the second coil portion 4109, and bend the second portion 2102 and the third portion 2103 of the second coil portion 4109 along directions opposite to the second portion 2102 and the third portion 2103 respectively. Furthermore, the user may bend the first coil portion 4108 to two sides of the first coil portion 4108 along the first protrusion part 1913 to form the structure shown in FIG. 17(a) and FIG. 17(b). In some embodiments, the first portion, the second portion, and the third portion may be bent in any order, for example, the user may first bend the second portion 2102 and the third portion 2103 of the second coil portion 4109 in opposite directions, and then bend the first portion 2101 down along its horizontal centerline L. The present disclosure does not impose specific restrictions on the bending order.

Figure 18A:
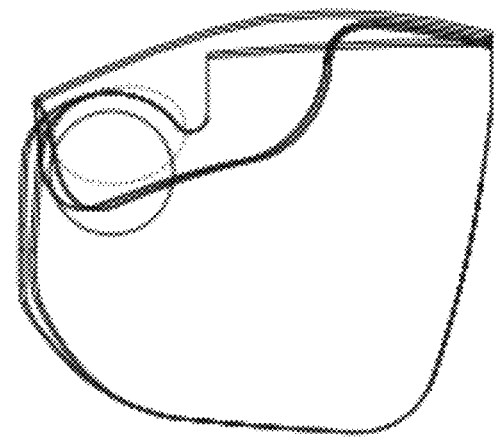
FIG. 18($b$) is a schematic diagram of exemplary bending of coil portions according to some other embodiments of the present disclosure
Figure 18B:
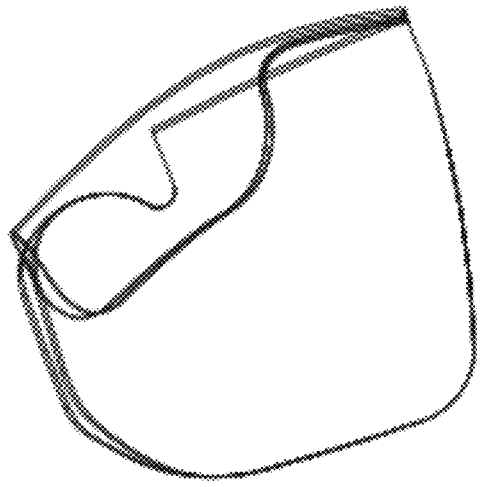

In some embodiments, the user may control a degree of the bending of the first coil portion and/or the second coil portion, so that the structure formed by the bending of the coil portions may match different objects or different scanning regions of a same object. FIG. 18(a) is a schematic diagram of exemplary bending of coil portions according to some embodiments of the present disclosure, and FIG. 18(b) is a schematic diagram of exemplary bending of coil portions according to some other embodiments of the present disclosure. As shown in FIG. 18(a) and FIG. 18(b), a user may control the degree of bending of the first coil portion to match different degrees of joint flexibility.

Figure 19:
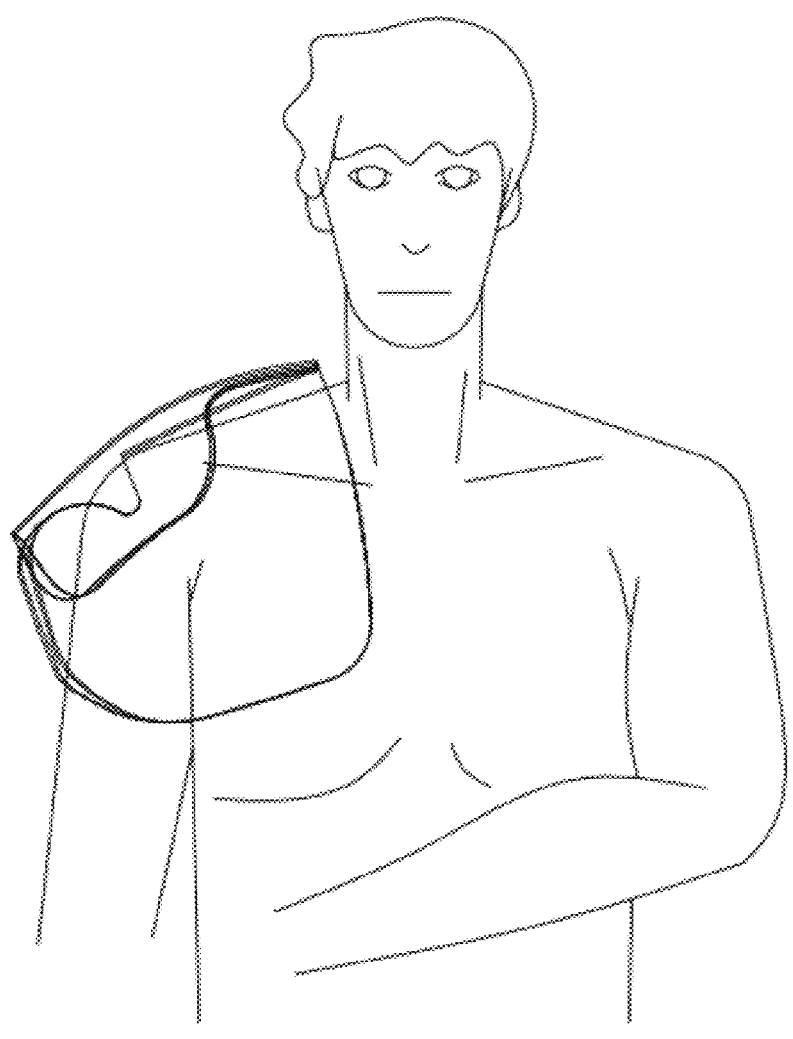
FIG. 19 is a schematic diagram of exemplary use of a radiofrequency coil according to some embodiments of the present disclosure.
Figure 20:
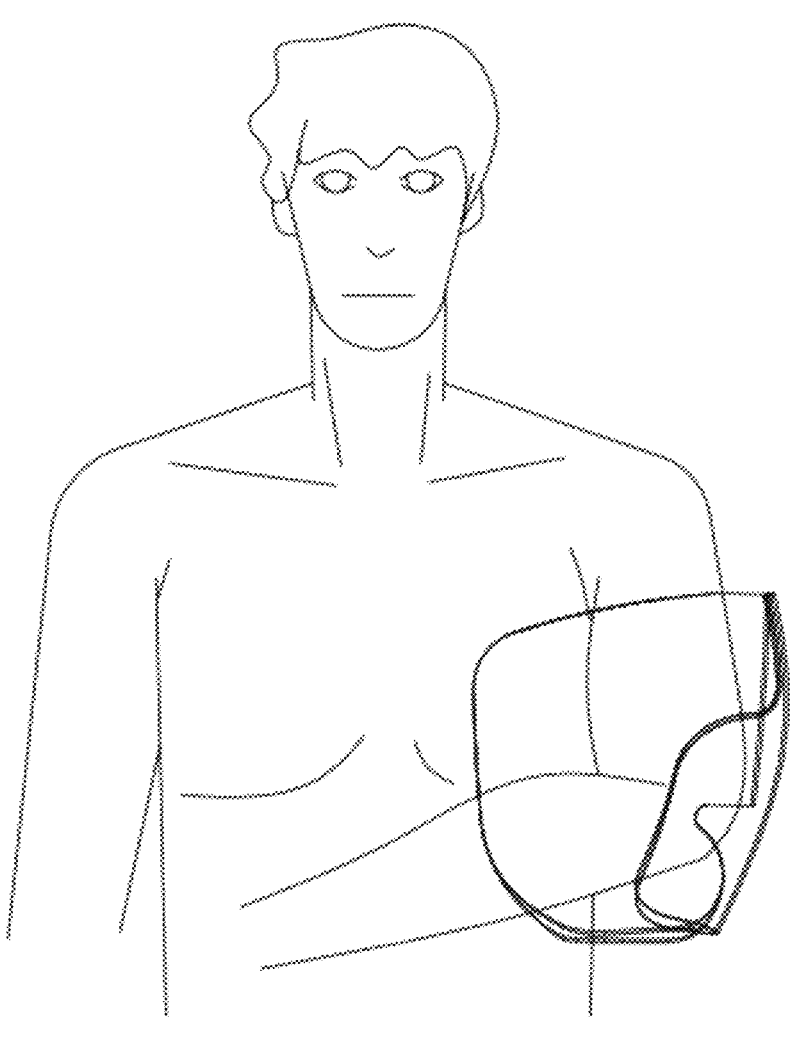
FIG. 20 is a schematic diagram of exemplary use of the radiofrequency coil according to some embodiments of the present disclosure.

FIG. 19 is a schematic diagram of exemplary use of a radiofrequency coil according to some embodiments of the present disclosure, and FIG. 20 is a schematic diagram of exemplary use of the radiofrequency coil according to some embodiments of the present disclosure. As shown in FIGS. 19 and 20, the structure formed by the bent coil portions may match a complex scanning region of an object, for example, the shoulders, elbow joints, or the like.

In some embodiments, dimensions of the first coil portion (e.g., the first coil portion 4105 or the first coil portion 4108) and the second coil portion (e.g., the second coil portion 4107 or the second coil portion 4109) may be adjusted based on a target scanning region of an object. For example, when the radiofrequency coil is used to scan a shoulder of the object, a length (e.g., the distance d1 as shown in FIG. 15) of the second coil portion 4109 may be greater than half of a length of an upper arm of the object, a width (e.g., the distance d2 as shown in FIG. 15) of the second coil portion 4109 may be greater than half of a cross-sectional circumference of the upper arm, and perimeters of the second portion 2102 and third portion 2103 of the second coil portion 4109 are about ¾ of a perimeter of the second coil portion 4109. As another example, a length of the protruding part (the second portion 2102 and the third portion 2103) of the second coil portion 4109 may be in the range of 20 cm to 40 cm.

Figure 14A:
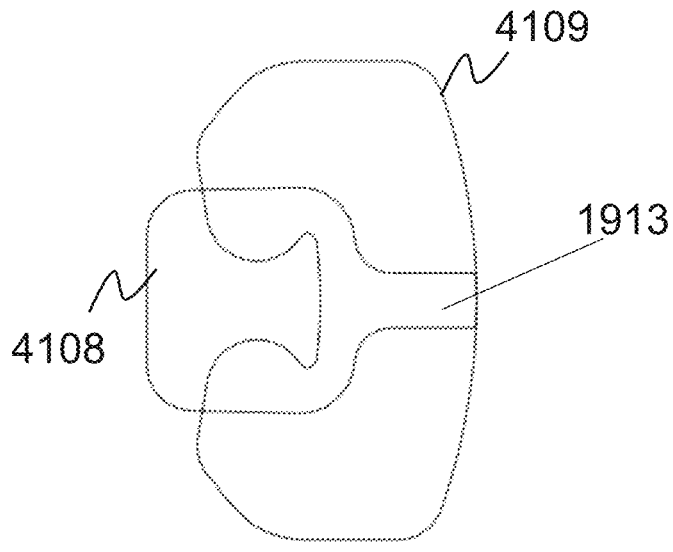
FIG. 14($a$) is a schematic diagram of exemplary joining of coil portions according to some embodiments of the present disclosure.
Figure 14B:
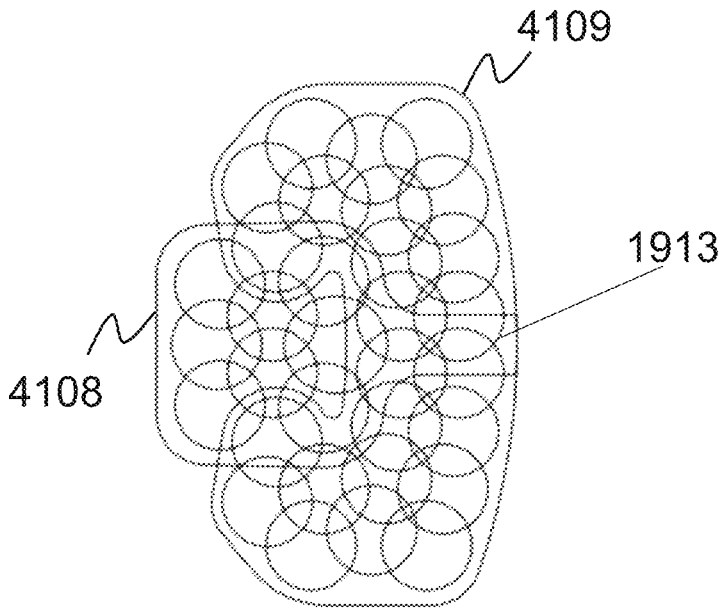
Figure 21:
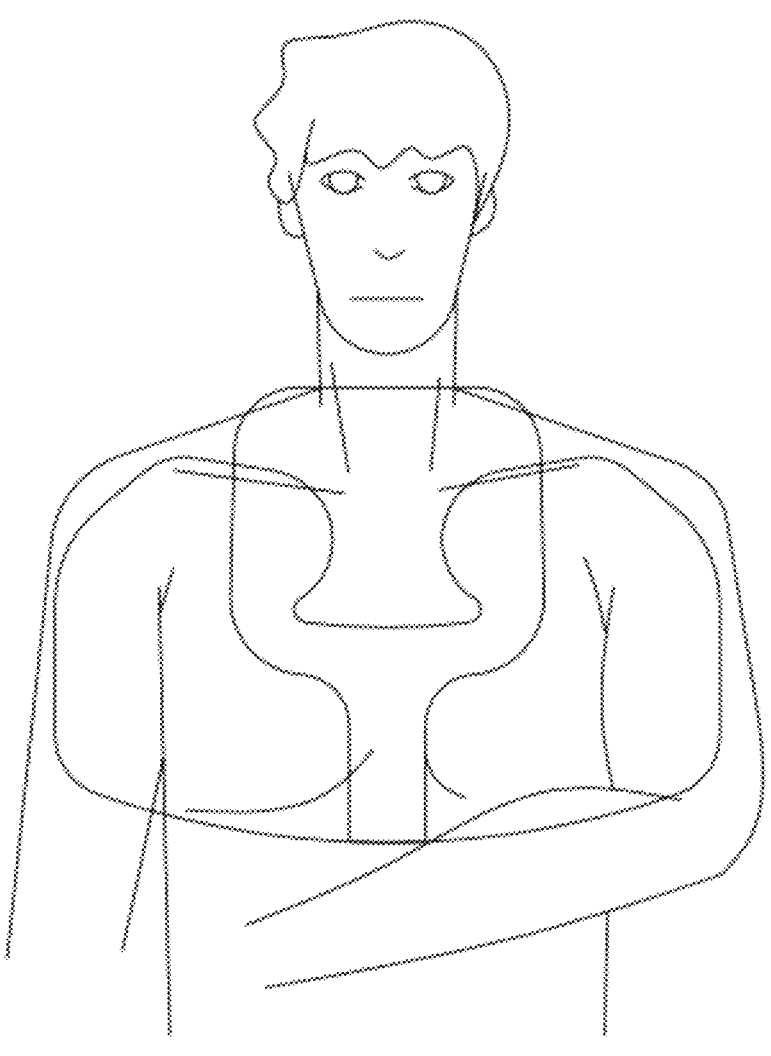
FIG. 21 is a schematic diagram of exemplary use of a radiofrequency coil according to some embodiments of the present disclosure.

In some embodiments, when the coil portions (e.g., the first coil portion 4105 or 4108, and the second coil portion 4107 or 4109) are not bent, the coil portions have a planar shape (e.g., the shape as shown in FIG. 14(a) or FIG. 14(b)). FIG. 21 is a schematic diagram of exemplary use of a radiofrequency coil according to some embodiments of the present disclosure. Since the coil portions are in the planar shape when not bent, the flattened coil portions may also be used as a regular radiofrequency coil. For example, as shown in FIG. 21, the flattened coil portion, after bending in one direction, may be used for scanning the torso of the object or for scanning the limbs of the object. By setting the coil portions as the planar shape when not bent, not only can the scanning region of the radiofrequency coil be increased, but the radiofrequency coil can also be applied to scanning various regions, e.g., the torso and limbs, expanding the range of use of the radiofrequency coil.

It should be noted that the examples in FIGS. 12 to 21 illustrate radiofrequency coils containing two coil portions. In some embodiments, the radiofrequency coil 400 may include three or more coil portions, without limitation in the present disclosure.

It should be noted that the above description of the radiofrequency coil 400 is provided for illustrative purposes only and is not intended to limit the scope of the present disclosure. Those skilled in the art may make various changes and modifications under the guidance of the content of the present disclosure. Various features, structures, methods, and other characteristics of the exemplary embodiments described in the present disclosure may be combined in various ways to obtain additional and/or alternative exemplary embodiments. However, these changes and modifications do not depart from the scope of the present disclosure.

Figure 22:
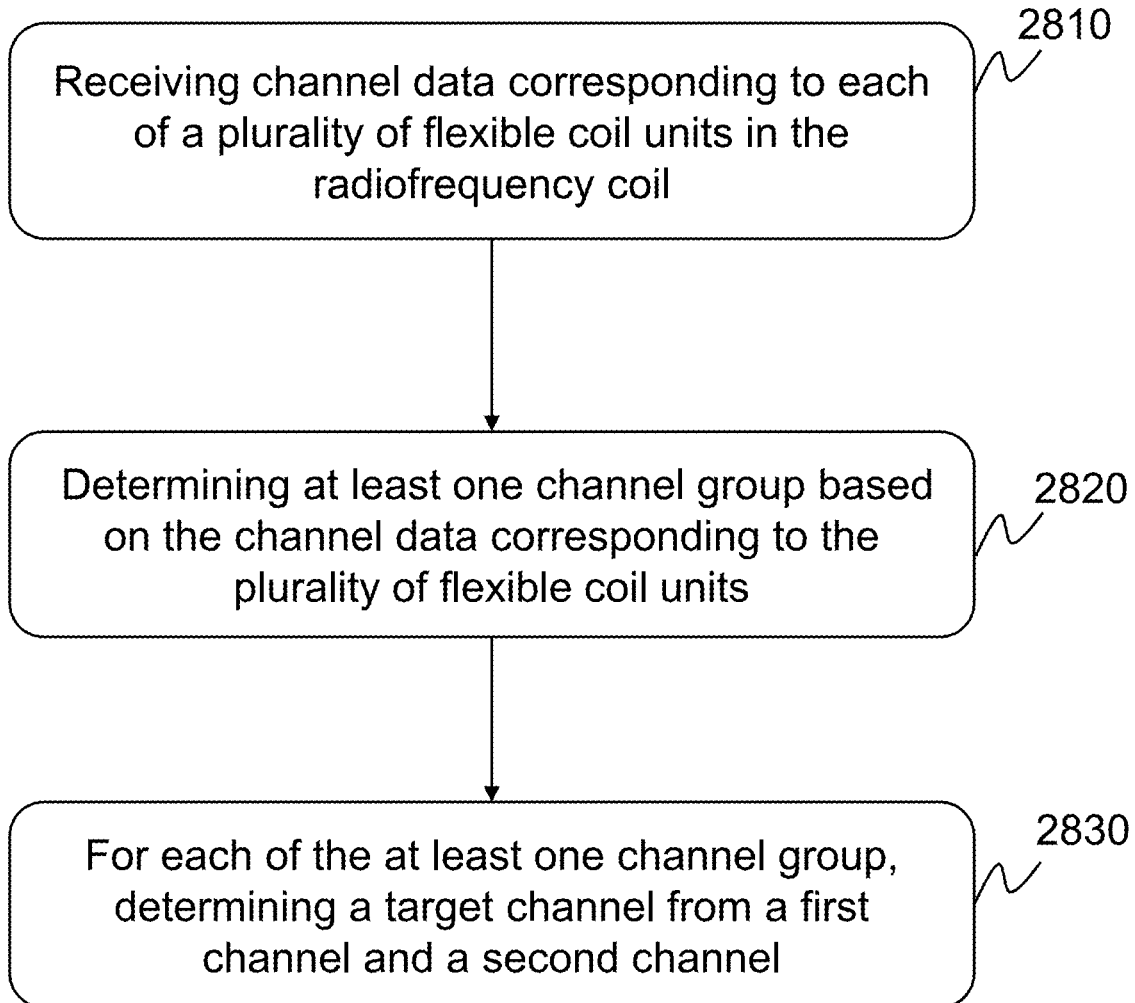
FIG. 22 is a schematic flowchart of an exemplary channel selection method according to some embodiments of the present disclosure.

FIG. 22 is a schematic flowchart of an exemplary channel selection method according to some embodiments of the present disclosure. As shown in FIG. 22, in some embodiments, a channel selection method 2800 for a radiofrequency coil may include the following steps:

In step 2810, receiving channel data corresponding to each of a plurality of flexible coil units in the radiofrequency coil. In some embodiments, step 2810 may be executed by a channel selection controller 3500 (e.g., a receiving module 3510).

The plurality of flexible coil units (e.g., the plurality of flexible coil units in a coil portion) in the radiofrequency coil (e.g., the radiofrequency coil 400) may include one or more receiving coils, with each receiving coil including one or more receiving channels. In some embodiments, the channel data corresponding to the each of the plurality of flexible coil units may include a strength, a noise, etc., of a magnetic resonance (MR) signal corresponding to a receiving channel.

In some embodiments, the channel selection controller (e.g., the channel selection controller 3500) may receive corresponding channel data for each of the plurality of flexible coil units. In some embodiments, the channel selection controller may receive channel data corresponding to each receiving coil in the plurality of flexible coil units. As an example, in FIG. 8, each "circle" represents a flexible coil unit. If the radiofrequency coil 400 includes flexible coil units 1, 2, . . . , and n, where n is a positive integer, the processing device 120 may receive channel data 1 corresponding to flexible coil unit 1, channel data 2 corresponding to flexible coil unit 2, . . . , and channel data n corresponding to flexible coil unit n.

In some embodiments, the channel data corresponding to the plurality of flexible coil units may include a first noise matrix, which is used to indicate one or more coupling parameters between any two flexible coil units. The one or more coupling parameters indicate load information of the any two flexible coil units, i.e., a noise matching status. The one or more coupling parameters are positively related to a degree of overlap between the any two flexible coil units. For example, the larger an overlapping region between the flexible coil units 1 and 2, the higher the one or more coupling parameters between the flexible coil units 1 and 2. One way to represent this relation is: the higher the one or more coupling parameters, the brighter (higher pixel values) the rectangular blocks corresponding to coordinates on the non-diagonal part in FIG. 23.

Figure 23:
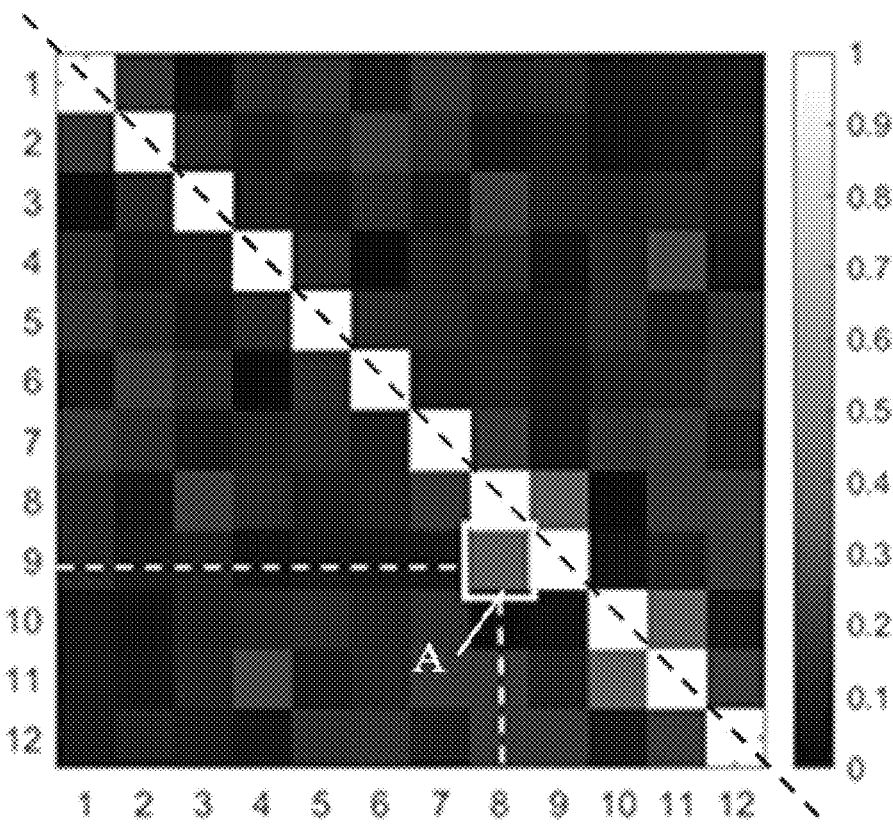
FIG. 23 is a schematic diagram of an exemplary first noise matrix according to some embodiments of the present disclosure.

FIG. 23 is a schematic diagram of an exemplary first noise matrix according to some embodiments of the present disclosure. The horizontal and vertical axes (e.g., the values 1-12) represent channels corresponding to the plurality of flexible coil units, i.e., 12 channels corresponding to 12 flexible coil units. The values (corresponding to pixel values in FIG. 23) along the diagonal (the black dashed line) from the upper left to the lower right in the matrix shown in FIG. 23 indicate self-load information of each channel, while the values off the diagonal represent the noise matching status between the various channels. The rectangular blocks of varying brightness and color from white to black in FIG. 23 correspond to different numerical values, with brighter (whiter) colors indicating higher values, i.e., higher pixel values. Taking the example of the radiofrequency coil 400 that includes the flexible coil units 1, 2, . . . , and 12, as shown in FIG. 23, the value of the white rectangular block A represents a coupling parameter between a channel corresponding to the flexible coil unit 8 and a channel corresponding to the flexible coil unit 9.

Figure 24:
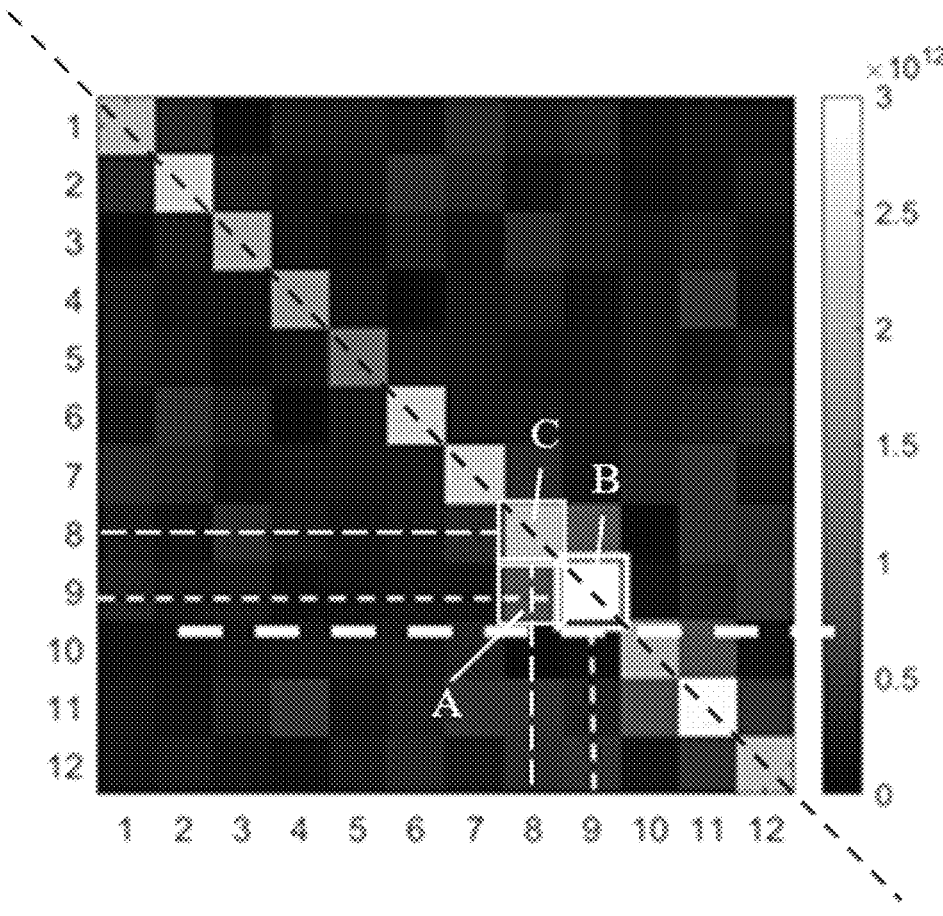
FIG. 24 is a schematic diagram of an exemplary second noise matrix according to some embodiments of the present disclosure.

In some embodiments, the channel data may include a second noise matrix, which is used to indicate absolute noise values, wherein each of the absolute noise values which corresponds to a channel of one of the plurality of flexible coil units. FIG. 24 is a schematic diagram of an exemplary second noise matrix according to some embodiments of the present disclosure. The horizontal and vertical axes represent channels corresponding to the plurality of flexible coil units, i.e., 12 channels corresponding to 12 flexible coil units. The values of the rectangular blocks on the diagonal (the black dashed line in the figure) indicate the absolute noise values of the channels corresponding to the plurality of flexible coil units. As shown in FIG. 24, continuing with the example of the radiofrequency coil 400 that includes the flexible coil units 1, 2, . . . , and 12, the value at the position shown by the white rectangular block B in FIG. 24 represents the absolute noise value of the channel corresponding to the flexible coil unit 9, while the value at the position shown by the white rectangular block C represents the absolute noise value of the channel corresponding to flexible coil unit 8. Similarly, the absolute noise values are represented by pixel values of the corresponding rectangular blocks, with brighter (whiter) colors indicating higher pixel values.

In step 2820, determining at least one channel group based on the channel data corresponding to the plurality of flexible coil units. In some embodiments, step 2820 may be executed by the channel selection controller 3500 (e.g., a first determination module 3520).

The channel group is used to indicate the presence of an overlapping region where two flexible coil units have an overlapping region exceeding a preset threshold. That is, for each of the at least one channel group, the channel group includes a first channel corresponding to a first flexible coil unit of the plurality of flexible coil units and a second channel corresponding to a second flexible coil unit of the plurality of flexible coil units. There is an overlapping region between the first flexible coil unit and the second flexible coil unit, and the overlapping region exceeds the preset threshold. The preset threshold may be flexibly set by a user or a system according to a specific requirement. For instance, a size of the preset threshold may be proportional to an area of the overlapping region between the two flexible coil units.

In some embodiments, there may be one or more pairs of flexible coil units in the radiofrequency coil having the overlapping region. The channel selection controller (e.g., the channel selection controller 3500) may determine at least one channel group with the overlapping region exceeding a preset threshold based on the channel data corresponding to each flexible coil unit. For example, after receiving channel data 1, channel data 2, . . . , and channel data n, the channel selection controller 3500 may determine a channel group 1 and a channel group 2, where the channel group 1 includes flexible coil units 1 and 2, and the channel group 2 includes flexible coil units 2 and 3. This means that the overlapping region between the flexible coil units 1 and 2 exceeds the preset threshold, and the overlapping region between the flexible coil units 2 and 3 exceeds the preset threshold.

In some embodiments, the channel selection controller (e.g., the channel selection controller 3500) may, for each of the plurality of flexible coil units, obtain a magnetic resonance (MR) signal of a channel corresponding to the flexible coil unit and determine the at least one channel group based on quality of the magnetic resonance signal of the channel corresponding to the flexible coil unit. In some embodiments, the channel selection controller may determine a coupling parameter with a maximum value in the first noise matrix for each of the plurality of flexible coil units and designate two channels corresponding to the coupling parameter with the maximum value as one of the at least one channel group.

In some embodiments, the channel selection controller may determine one or more coupling parameters between any two flexible coil units based on the first noise matrix corresponding to the plurality of flexible coil units, and designate two channels corresponding two flexible coil units with the coupling parameter greater than a preset coupling parameter as one of the at least one channel group. Further details may be found in FIG. 25 and its related description.

In some embodiments, the channel selection controller may determine the at least one channel group based on the channel data corresponding to each of the plurality of flexible coil units through other approaches, without specific limitations in the present disclosure.

In step 2830, for each of the at least one channel group, determining a target channel from the first channel and the second channel. In some embodiments, step 2830 may be executed by the channel selection controller 3500 (e.g., a second determination module 3530).

The target channel refers to one of channels corresponding to the flexible coil unit where over-coupling exists. Referencing FIG. 2, when an imaging range of the radiofrequency coil exceeds the target scanning region, there may be overlap among some of the flexible coil units in the radiofrequency coil, resulting in over-coupling between channels in the overlapped region. To avoid over-coupling between the channels, for each of the at least one channel group, the channel selection controller determines the target channel from the first channel and the second channel and turns off the target channel or a channel over-coupled with the target channel during an MRI scan to enhance quality of a scanned image.

In some embodiments, the target channel may be a channel that needs to be turned off in the at least one channel group or a channel that needs to be retained in the at least one channel group.

In some embodiments, the channel selection controller (e.g., the channel selection controller 3500) may randomly select a channel from the at least one channel group as a corresponding target channel. For example, channel selection controller 3500 may randomly select a channel corresponding to the flexible coil unit 1 from the channel group 1 as the target channel for the channel group 1 and select a channel corresponding to the flexible coil unit 3 from the channel group 2 as the target channel for the channel group 2.

In some embodiments, for each of the at least one channel group, the channel selection controller may determine the absolute noise values for the first channel and the second channel based on the second noise matrix, and then determines the target channel based on the absolute noise values of the first channel and the second channel. Further details may be found in the description related to FIG. 26.

In some embodiments, after determining the target channels corresponding to the at least one channel group, the channel selection controller may turn off the target channels in the at least one channel group, i.e., stop receiving channel data from the target channels corresponding to the at least one channel group. This prevents a decrease in image quality caused by excessive overlap between flexible coil units. In some embodiments, the channel selection controller may retain the target channels in the at least one channel group and turn off channels in the at least one channel group that are over-coupled with the target channels. For example, the channel selection controller 3500 may control resonance of the target channels in the at least one channel group and detune the channels in the at least one channel group that are over-coupled with the target channels.

The channel selection method for the radiofrequency coil provided in this embodiment determines the at least one channel group based on the channel data corresponding to each of the plurality of flexible coil units, then for each of the at least one channel group, selects the target channel from the first channel and the second channel. This method allows the user to promptly identify a situation where the plurality of flexible coil units have substantial overlap (e.g., the overlapping region exceeding the preset threshold) based on the channel data corresponding to each of the plurality of flexible coil units and select the target channels from the at least one channel group. This makes it easier to stop receiving the channel data from the target channels (or the channels over-coupled with the target channels) during the use of the radiofrequency coil, avoiding noise interference and improving accuracy of data acquisition.

FIG. 25 is a schematic diagram of an exemplary process for determining a channel group according to some embodiments of the present disclosure. As shown in FIG. 25, in some embodiments, a process 3100 may include the following steps:

In step 3110, determining one or more coupling parameters between any two of a plurality of flexible coil units based on a first noise matrix corresponding to the plurality of flexible coil units. In some embodiments, step 3110 may be executed by the channel selection controller 3500.

In some embodiments, the channel selection controller (e.g., the channel selection controller 3500) may determine the first noise matrix corresponding to the plurality of flexible coil units based on the channel data corresponding to the plurality of flexible coil units. Further, the channel selection controller may determine the one or more coupling parameters between the any two flexible coil units based on the first noise matrix corresponding to the plurality of flexible coil units.

In some embodiments, the channel selection controller may obtain first noise data for the channels corresponding to the plurality of flexible coil units (e.g., one or more receiving coils in the plurality of flexible coil units) and determine the first noise matrix based on the first noise data. For example, the channel selection controller 3500 may obtain first noise data for channels corresponding to two flexible coil units that are concatenated together and used for a magnetic resonance imaging (MRI) scan of an object.

In some embodiments, the channel selection controller may obtain the first noise data in real-time during a calibration phase (e.g., before, during, or after setting of a scanning parameter for the imaging device) of an imaging device or during a scanning phase. The calibration phase refers to a process of setting the scanning parameter for the imaging device based on patient information (e.g., a scanning region), and the scanning phase refers to a process of conducting an MRI scan on a patient. For example, the channel selection controller 3500 may, during a process of positioning the object for MRI scanning, obtain a magnetic resonance (MR) signal through the receiving coils in the plurality of flexible coil units before each radiofrequency signal excitation in the radiofrequency coil, thereby obtaining the first noise data for the channels corresponding to the receiving coils.

As mentioned earlier, the first noise matrix reflects a coupling relationship between channels. In the first noise matrix, the values on the diagonal reflect auto-correlation characteristics of the channels, while the values off the diagonal reflect cross-correlation characteristics between the channels. In some embodiments, two sets of non-diagonal values located on two sides of the diagonal in the first noise matrix are mutually symmetrical.

In some embodiments, the channel selection controller may determine the first noise matrix based on the first noise data using a predefined algorithm. Optionally, the channel selection controller may obtain the first noise matrix by performing a complex conjugate dot product on the obtained first noise data for each channel. The channel selection controller may also post-process (e.g., normalizing) a constructed initial noise matrix (e.g., a matrix obtained through the complex conjugate dot product) to obtain the first noise matrix. By normalizing the initial noise matrix and performing other post-processing operations, the first noise matrix becomes visual and facilitates analysis of noise data.

For example, the channel selection controller, by processing the first noise data for each channel using the complex conjugate dot product or a technique like phase noise in statistics, may obtain an initial square matrix similar to the matrix shown in FIG. 24, where each value in the obtained initial square matrix falls within the range of $0*10^{12}$ to $3*10^{12}$. Furthermore, after post-processing, e.g., normalization, the channel selection controller may obtain a square matrix similar to the matrix shown in FIG. 23, where each value in the obtained matrix falls within the range of 0 to 1. For example, the value of the white rectangular block A off the diagonal in FIG. 23 may represent a result of dot product of noise data of the channel corresponding to the flexible coil unit 8 and noise data of the channel corresponding to the flexible coil unit 9, and the value of the rectangular block B on the diagonal may represent a result of auto-multiplication of noise data of the channel corresponding to the flexible coil unit 9.

In step 3120, designating two channels corresponding two flexible coil units with the coupling parameter greater than a preset coupling parameter as one of the at least one channel group. In some embodiments, step 3120 may be executed by the channel selection controller 3500.

When the overlapping region between the plurality of flexible coil units exceeds a preset threshold, the values of the non-diagonal part of the corresponding first noise matrix become higher, indicating a non-conventional coupling relationships between channels. Therefore, based on the first noise matrix, the channel selection controller may select two channels corresponding two flexible coil units with the coupling parameter greater than the preset coupling parameter as one of the at least one channel group.

For example, as shown in FIG. 23, for a group of values of the non-diagonal part below the diagonal represented by the black dashed line, the channel selection controller may compare each value with its corresponding preset coupling parameter and select the rectangular block A, which represents the dot product result between the channels corresponding to the flexible coil unit 8 and the flexible coil unit 9. Because the dot product result represented by the rectangular block A is greater than the preset coupling parameter, the channel selection controller may determine that there is over-coupling between the channels corresponding to the flexible coil unit 8 and the flexible coil unit 9, and designate the flexible coil unit 8 and the flexible coil unit 9 as one of the at least one channel group. The preset coupling parameter may be set as required, with a value being greater than 0.

FIG. 26 is a schematic flowchart of an exemplary process for determining a target channel according to some embodiments of the present disclosure. In some embodiments, as shown in FIG. 26, a process 3200 may include the following steps:

In step 3210, determining absolute noise values of a first channel and a second channel in each channel group based on a second noise matrix. In some embodiments, step 3210 may be executed by the channel selection controller 3500.

As mentioned earlier, the channel data also includes the second noise matrix used to indicate the absolute noise values, each of which corresponding to a channel of one of the plurality of flexible coil units. In some embodiments, the channel selection controller (e.g., the channel selection controller 3500) may determine the absolute noise values of the first channel and the second channel in each of the at least one channel group based on the second noise matrix.

For example, as shown in FIG. 24, the channel selection controller 3500 may determine the absolute noise values of the first channel and the second channel in each channel group based on the values on the diagonal indicated by the black dashed line in the second noise matrix in FIG. 24. For example, the channel selection controller may determine the value represented by the rectangular block B as the absolute noise value of the channel corresponding to the flexible coil unit 9 and the value represented by the rectangular block C as the absolute noise value of the channel corresponding to the flexible coil unit 8.

In step 3220, for each of the at least one channel group, determining the target channel based on the absolute noise values of the first channel and the second channel. In some embodiments, step 3220 may be executed by the channel selection controller 3500.

In some embodiments, for each of the at least one channel group, the channel selection controller may select a channel with a maximum absolute noise value between the first channel and the second channel as the target channel.

In some embodiments, the channel selection controller may, based on a noise threshold, determine the target channel using the absolute noise values of the first channel and the second channel. For example, channel selection controller 3500 may designate a channel in the at least one channel group whose absolute noise value is greater than the noise threshold as the target channel. In this case, the target channel is a channel in the at least one channel group that is further from the object, i.e., one of two or more coupled channels that is further from a target scanning region of the object. The target channel may be turned off during an MRI scan (i.e., not receiving data of the target channel). Alternatively, the channel selection controller may designate a channel in the at least one channel group whose absolute noise value is less than the noise threshold as the target channel. In this case, the target channel is a channel in the at least one channel group that is closer to the object, i.e., one of two or more coupled channels that is closer to the target scanning region of the object. The target channel may be retained during the MRI scan, and channels that are over-coupled with the target channel may be turned off.

Since the values of the diagonal part of the noise matrix (e.g., the second noise matrix) may reflect the noise matching status of the flexible coil unit, when a channel corresponding to a particular flexible coil unit is elevated (e.g., due to excessive overlap causing a channel corresponding to a peripheral flexible coil unit to be far from the target scanning region), a load of the channel may change, and a value of the channel on a position of the diagonal of the noise matrix may deviate from a standard level. Therefore, the channel selection controller may determine the absolute noise values of the first channel and the second channel in each of the at least one channel group based on the second noise matrix and determine the target channel based on the noise threshold and the absolute noise values.

For example, as shown in FIG. 24, after determining the channels corresponding to the flexible coil unit 8 and the flexible coil unit 9 as one of the at least one channel group, the channel selection controller may compare diagonal values (values corresponding to the rectangular blocks B and C in the figure) of the flexible coil unit 8 and the flexible coil unit 9 in the second noise matrix, i.e., the absolute noise values of the channels corresponding to the flexible coil unit 8 and the flexible coil unit 9, respectively, with corresponding noise thresholds. The channel selection controller may select the target channel, e.g., the channel corresponding to the flexible coil unit 8, if the diagonal value is less than the corresponding noise threshold. The target channel may be retained during the MRI scan.

In some embodiments, for each of the at least one channel group, the channel selection controller may determine a first difference between the absolute noise value of the first channel and the first noise threshold corresponding to the first channel, and a second difference between the absolute noise value of the second channel and the second noise threshold corresponding to the second channel. Based on the first difference and the second difference, the channel selection controller may determine the target channels for the each of the at least one channel group. More details may be found in descriptions of FIG. 27.

In this embodiment, by determining the target channel based on the absolute noise values of the first channel and the second channel in each channel group, it is possible to select a more suitable target channel from the first channel and the second channel, thereby improving the quality of imaging.

FIG. 27 is a schematic flowchart of an exemplary process for determining a target channel according to some other embodiments of the present disclosure. As shown in FIG. 33, in some embodiments, a method 3300 may include the following steps:

In step 3310, for each of the at least one channel group, determining a first difference between an absolute noise value of a first channel in the channel group and a first noise threshold corresponding to the first channel.

In some embodiments, each flexible coil unit may correspond to different noise thresholds. In some embodiments, when there is no overlap between the flexible coil units in the radiofrequency coil, the channel selection controller may determine noise values of corresponding channels as the noise thresholds. For example, when the coil portions of the radiofrequency coil are in a flat state, the channel selection controller 3500 may record a noise value of flexible coil unit 1 at this time as the noise threshold for the flexible coil unit 1, record a noise value of flexible coil unit 2 at this time as the noise threshold for the flexible coil unit 2, and similarly determine the noise threshold for each flexible coil unit.

Furthermore, for each of the determined at least one channel group, the channel selection controller may calculate the first difference between the absolute noise value of the first channel and the first noise threshold corresponding to the first channel.

In step 3320, for each of the at least one channel group, determining a second difference between an absolute noise value of a second channel in the channel group and a second noise threshold corresponding to the second channel.

Similar to step 3310, for each of the at least one channel group, the channel selection controller may determine the absolute noise value of the second channel based on the second noise matrix. Then, the channel selection controller may determine the second noise threshold corresponding to the second channel, thereby determining the second difference between the absolute noise value of the second channel and the second noise threshold.

By way of example, taking the channel group consisting of a channel (i.e., the first channel) corresponding to flexible coil unit 8 and a channel (i.e., the second channel) corresponding to flexible coil unit 9 as an example, the channel selection controller may use the second noise matrix shown in FIG. 24 to determine the value represented by the rectangular block B as the absolute noise value of the channel corresponding to the flexible coil unit 9 and the value represented by the rectangular block C as the absolute noise value of the channel corresponding to the flexible coil unit 8. Further, the channel selection controller may determine the first noise threshold for the channel corresponding to the flexible coil unit 8 and the second noise threshold for the channel corresponding to the flexible coil unit 9. This allows the determination of the first difference between the absolute noise value of the channel corresponding to the flexible coil unit 8 and the first noise threshold, as well as the second difference between the absolute noise value of the channel corresponding to the flexible coil unit 9 and the second noise threshold.

In step 3330, for each of the at least one channel group, determining a corresponding target channel based on the first difference and the second difference.

The first difference and the second difference are used to indicate changes in the noise level of the corresponding flexible coil unit, indirectly reflecting the proximity of the corresponding flexible coil unit to the target scanning region of the object. For example, when the target scanning region is closer to the flexible coil unit, the absolute values of the first difference and the second difference are larger.

In some embodiments, the channel selection controller may determine a maximum value between the absolute values of the first difference and the second difference and designate the channel corresponding to the maximum value as the target channel. More details may be found in descriptions of FIG. 28.

In some embodiments, the channel selection controller may determine the target channel based on a quotient of the absolute values of the first difference and the second difference. For example, the channel selection controller may determine the first channel as the target channel for the at least one channel group when the quotient is less than a preset value, and the second channel as the target channel for the at least one channel group when the quotient is greater than the preset value.

Furthermore, the channel selection controller may choose to turn off a channel corresponding to a flexible coil unit that is far away from the target scanning region in the at least one channel group, e.g., the target channel or the channel that is over-coupled with the target channel.

Figure 28:
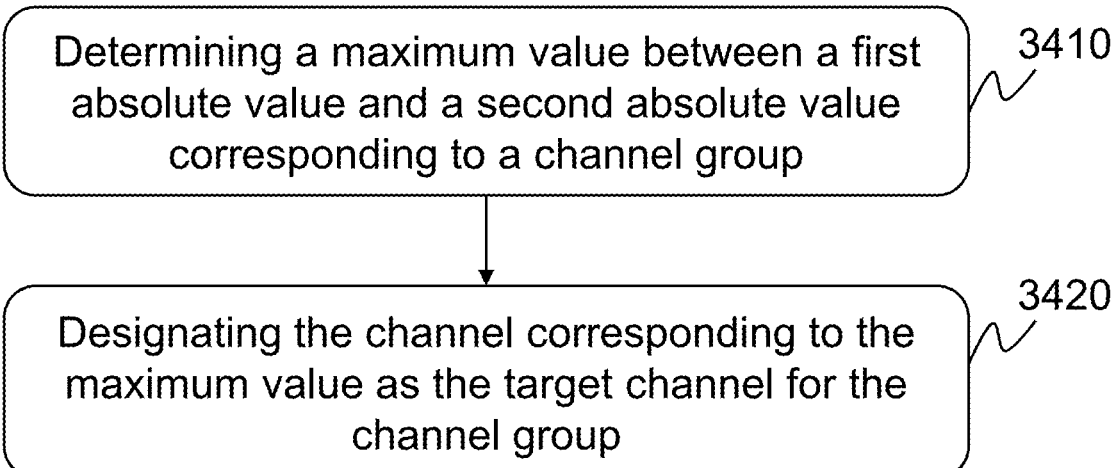
FIG. 28 is a schematic flowchart of an exemplary process for determining the target channel according to some other embodiments of the present disclosure.

FIG. 28 is a schematic flowchart of an exemplary process for determining the target channel according to some other embodiments of the present disclosure. As shown in FIG. 28, in some embodiments, a method 3400 may include the following steps:

In step 3410, determining a maximum value between a first absolute value and a second absolute value corresponding to a channel group.

The first absolute value refers to an absolute value of the first difference corresponding to the first channel of the channel group, and the second absolute value refers to an absolute value of the second difference corresponding to the second channel of the channel group. For each of the determined at least one channel group, the channel selection controller may determine the absolute value of the first difference corresponding to the first channel as the first absolute value, and the absolute value of the second difference corresponding to the second channel as the second absolute value, thereby determining the maximum value between the first absolute value and the second absolute value.

In step 3420, designating the channel corresponding to the maximum value as the target channel for the channel group.

For example, if a determined channel group 1 includes a first channel corresponding to flexible coil unit 1 and a second channel corresponding to flexible coil unit 2, and let the absolute noise value corresponding to the first channel be A, the noise value corresponding to the second channel be B, the first noise threshold corresponding to the first channel (i.e., the noise threshold corresponding to flexible coil unit 1) be C, and the second noise threshold corresponding to the second channel (i.e., the noise threshold corresponding to flexible coil unit 2) be D. The channel selection controller may then determine that the first absolute value is |A–C|, and the second absolute value is |B–D|. If |A–C|>|B–D|, the channel selection controller may designate the first channel, i.e., the channel corresponding to the flexible coil unit 1, as the target channel. If |A–C|≤|B–D|, the channel selection controller may designate the second channel, i.e., the channel corresponding to the flexible coil unit 2, as the target channel.

In this embodiment, the target channel for each channel group is determined based on the maximum value between the first absolute value and the second absolute value, and the channel corresponding to the maximum value is designated as the target channel for the corresponding channel group. Since the first absolute value represents the absolute value of the first difference and the second absolute value represents the absolute value of the second difference, the determined target channel differs significantly from the noise threshold, indicating that the target channel is further from the target scanning region. In magnetic resonance imaging (MRI), the channel selection controller may control the cessation of receiving channel data for the target channel, thereby improving data acquisition accuracy and imaging quality.

It should be noted that the above descriptions of the channel selection methods 2800 to 3400 are for illustrative purposes only and are not intended to limit the scope of the present disclosure. Those skilled in the art may make various modifications and variations based on the present disclosure. For example, the method 2800 may be applied not only to the radiofrequency coil 400 for MRI described above in the present disclosure but also to other radiofrequency coils (e.g., the radiofrequency coils shown in FIG. 2 or 3) for MRI. However, these changes and modifications do not depart from the scope of the present disclosure.

Figure 29:
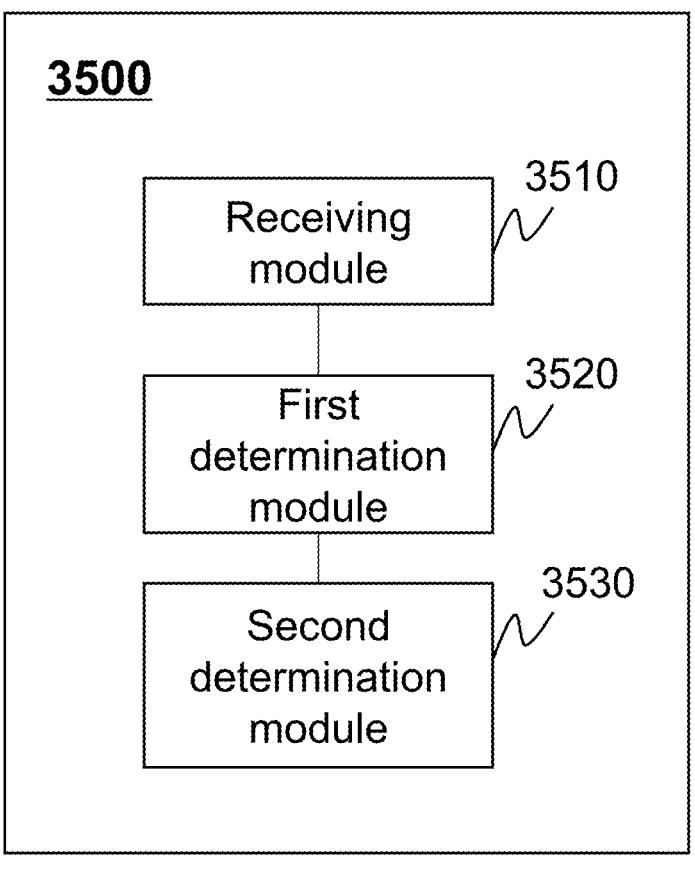
FIG. 29 is a schematic diagram of an exemplary channel selection controller according to some embodiments of the present disclosure.

FIG. 29 is a schematic diagram of an exemplary channel selection controller according to some embodiments of the present disclosure. As shown in FIG. 29, in some embodiments, the channel selection controller 3500 may include the receiving module 3510, the first determination module 3520, and the second determination module 3530.

The receiving module 3510 is configured to receive channel data corresponding to each of a plurality of flexible coil units in the radiofrequency coil. In some embodiments, the channel data corresponding to the plurality of flexible coil units may include a first noise matrix, which is used to indicate one or more coupling parameters between any two flexible coil units. In some embodiments, the channel data may also include a second noise matrix, which is used to indicate absolute noise values, each of which corresponding to a channel of one of the plurality of flexible coil units.

The first determination module 3520 is configured to determine at least one channel group based on the channel data corresponding to the plurality of flexible coil unit. For each of the at least one channel group, the channel group includes a first channel corresponding to a first flexible coil unit of the plurality of flexible coil units and a second channel corresponding to a second flexible coil unit of the plurality of flexible coil units. There is an overlapping region between the first flexible coil unit and the second flexible coil unit, and the overlapping region exceeds a preset threshold.

In some embodiments, the first determination module 3520 may further include a first determination unit (not shown in the figure) and a second determination unit (not shown in the figure). The first determination unit is configured to determine the one or more coupling parameters based on the first noise matrix. The second determination unit is configured to designate two channels corresponding two flexible coil units with the coupling parameter greater than a preset coupling parameter as one of the at least one channel group.

The second determination module 3530 is configured to determine, for each of the at least one channel group, the target channel from the first channel and the second channel.

In some embodiments, the second determination module 3530 may further include a third determination unit and a fourth determination unit. The third determination unit is configured to determine, for each of the at least one channel group, the absolute noise values of the first channel and the second channel based on the second noise matrix. The fourth determination unit is configured to determine, for each of the at least one channel group, the target channel based on the absolute noise values of the first channel and the second channel.

In some embodiments, the fourth determination unit may include a first determination subunit, a second determination subunit, and a third determination subunit. The first determination subunit is configured to determine, for each of the at least one channel group, the first difference between the absolute noise value of the first channel and the first noise threshold corresponding to the first channel. The second determination subunit is configured to determine, for each of the at least one channel group, the second difference between the absolute noise value of the second channel and the second noise threshold corresponding to the second channel. The third determination subunit is configured to determine the target channel corresponding to each of the at least one channel group based on the first difference and the second difference.

In some embodiments, the third determination subunit may be configured to determine the maximum value between the absolute value of the first difference and the absolute value of the second difference, and designate the channel corresponding to the maximum value as the target channel.

The various modules in the channel selection controller 3500 described above may be fully or partially implemented through software, hardware, or combinations thereof. The modules may be embedded in or independent of a processor (e.g., the processing device 120) in the form of hardware, or stored in a memory (e.g., the storage device 140) of a computer device in software form for the processor to call to execute corresponding operations of the modules.

Figure 30:
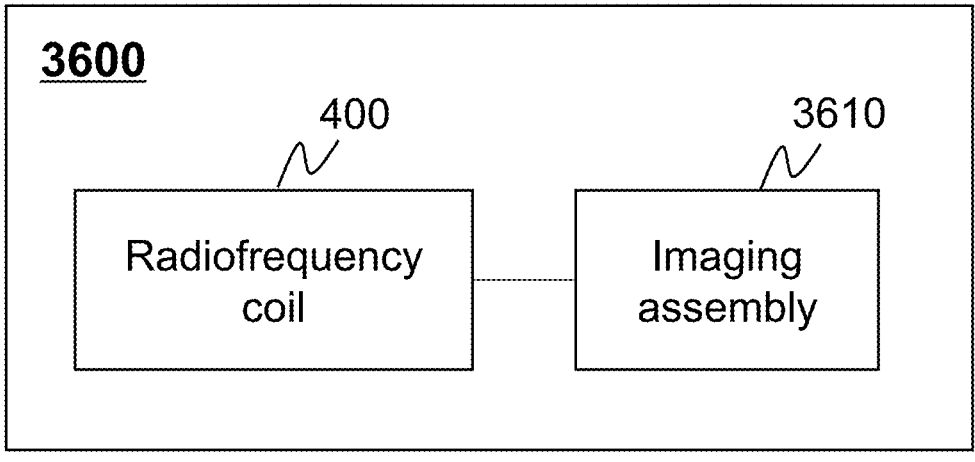
FIG. 30 is a schematic diagram of an exemplary magnetic resonance (MR) device according to some embodiments of the present disclosure.

FIG. 30 is a schematic diagram of an exemplary magnetic resonance (MR) device according to some embodiments of the present disclosure.

In some embodiments, as shown in FIG. 30, a magnetic resonance device 3600 may include the radiofrequency coil 400 and an imaging assembly 3610, where the imaging assembly 3610 has an imaging region. A preamplifier (e.g., the preamplifier 430) of the radiofrequency coil 400 is located outside the imaging region.

The imaging assembly 3610 may be an electronic device for reconstructing an image. In some embodiments, the imaging assembly 3610 may perform image reconstruction based on a magnetic resonance (MR) signal and output image information corresponding to the MR signal. In some embodiments, the imaging assembly 3610 may be a host with image processing capabilities, a terminal device, etc. In some embodiments, the imaging assembly 3610 may perform the image reconstruction using an image processing technique such as projection reconstruction, brightness and contrast enhancement, stereo vision reconstruction, laser ranging reconstruction, etc. A specific type of image processing technique may be chosen based on a type of an acquired radiofrequency signal. For example, the imaging assembly 3610 may generate an image based on spatial data (e.g., k-space data) carried by the MR signal through inverse Fourier transformation.

In some embodiments, the imaging assembly 3610 may perform the image reconstruction based on the MR signal within the imaging region. Correspondingly, the preamplifier 430 of the radiofrequency coil 400 of the disclosed embodiments may be disposed outside the imaging region to prevent a magnetic field of a radiofrequency component (the preamplifier 430) from affecting image quality and increase the imaging quality. This configuration can also avoid a rigid component (e.g., the preamplifier 430) affecting flexibility of the imaging region, improving conformability of the radiofrequency coil 400 with a human body, thereby enhancing a signal-to-noise ratio of the image output by the imaging assembly 3610.

In some embodiments, the magnetic resonance device 3600 may further include one or more of a main magnet, a gradient coil, a control device, a spectrometer, an examination bed, etc. In some embodiments, a type of the magnetic resonance device 3600 may include one or more of a magnetic resonance imaging (MRI) device, a nuclear magnetic resonance (NMR) device, a magnetic resonance spectroscopy (MRS) device, a magnetic resonance spectroscopy imaging (MRSI) device, etc. In some embodiments, the magnetic resonance device 3600 may use a chemical shift difference between different MR signals to identify different chemical components in a spectroscopic composition, outputting image information corresponding to the MR signals.

It should be noted that the radiofrequency coil 400 may be applied not only to the magnetic resonance device 3600 but also to other systems that require signal acquisition. For example, the radiofrequency coil 400 may be applied to geological exploration equipment to obtain a plurality of MR signals, determining geological distribution information corresponding to the MR signals. As another example, the radiofrequency coil 400 may be applied to chemical analysis equipment to obtain a plurality of magnetic resonance signals returned from a material to be analyzed to determine material composition, distribution, and other information corresponding to the plurality of magnetic resonance signals.

In some embodiments, the magnetic resonance device 3600 may include a connector head disposed on the imaging assembly 3610. In some embodiments, the radiofrequency coil 400 may be removably connected to the imaging assembly 3610 via the connector head. When the connector head is in a connected state, it may be used to transmit a magnetic resonance signal. When the connector head is in a disconnected state, the imaging assembly 3610 may be separated from the radiofrequency coil 400. Thus, by using a removable connector head, different radiofrequency coils 400 may be quickly switched to collect magnetic resonance signals from different parts of the human body, improving data acquisition efficiency.

It should be noted that the description of the magnetic resonance device 3600 provided above is for illustrative purposes only and is not intended to limit the scope of the present disclosure. Those skilled in the art may make various changes and modifications under the guidance of the present disclosure. The features, structures, methods, and other features of the illustrative embodiments described in the present disclosure may be combined in various ways to obtain additional and/or alternative illustrative embodiments. However, these variations and modifications are not outside the scope of the present disclosure.

The basic concepts have been described above, and it is apparent to those skilled in the art that the foregoing detailed disclosure is intended as an example only and does not constitute a limitation of the present disclosure. Although not expressly stated herein, those skilled in the art may make various modifications, improvements, and amendments to the present disclosure. Such modifications, improvements, and amendments are suggested in the present disclosure, so such modifications, improvements, and amendments remain within the spirit and scope of the exemplary embodiments of the present disclosure.

At the same time, specific terms are employed to describe the embodiments of the present disclosure. Terms e.g., "an embodiment," "one embodiment," and/or "some embodiments" are intended to refer to one or more features, structures, or characteristics associated with at least one embodiment of the present disclosure. Thus, it should be emphasized and noted that the terms "an embodiment," "one embodiment," or "an alternative embodiment," mentioned at different locations in the present disclosure two or more times, do not necessarily refer to a same embodiment. Additionally, certain features, structures, or characteristics of one or more embodiments of the present disclosure may be appropriately combined.

Additionally, unless explicitly stated in the claims, the order of processing elements and sequences, the use of numerical or alphabetical characters, or the use of other names in the present disclosure are not intended to limit the order of the processes and methods. While various examples have been discussed in the disclosure as presently considered useful embodiments of the invention, it should be understood that such details are provided for illustrative purposes only. The appended claims are not limited to the disclosed embodiments, but instead, the claims are intended to cover all modifications and equivalent combinations that fall within the scope and spirit of the present disclosure. For example, although system components described above may be implemented through hardware devices, they may also be implemented solely through software solutions, e.g., installing the described system on existing processing equipment or mobile devices.

Similarly, it should be noted that, for the sake of simplifying the disclosure of the embodiments of the present disclosure to aid in understanding of one or more embodiments, various features are sometimes grouped together in one embodiment, drawing, or description. However, this manner of disclosure is not to be interpreted as requiring more features than are expressly recited in the claims. In fact, the features of various embodiments may be less than all of the features of a single disclosed embodiment.

Some embodiments use numbers to describe the number of components, and attributes, and it should be understood that such numbers used in the description of the embodiments are modified in some examples by the modifiers "about", "approximately", or "generally". Unless otherwise stated, "about", "approximately" or "generally" indicates that a variation of ±20% is permitted. Accordingly, in some embodiments, the numerical parameters used in the present disclosure and claims are approximations, which may change depending on the desired characteristics of the individual embodiment. In some embodiments, the numeric parameters should be considered with the specified significant figures and be rounded to a general number of decimal places. Although the numerical domains and parameters configured to confirm the breadth of their ranges in some embodiments of the present disclosure are approximations, in specific embodiments such values are set as precisely as possible within the feasible range.

With respect to each patent, patent application, patent application disclosure, and other material, e.g., articles, books, manuals, publications, documents, etc., cited in the present disclosure, the entire contents thereof are hereby incorporated herein by reference. Application history documents that are inconsistent with or conflict with the contents of the present disclosure are excluded, as are documents (currently or hereafter appended to the present disclosure) that limit the broadest scope of the claims of the present disclosure. It should be noted that in the event of any inconsistency or conflict between the descriptions, definitions, and/or use of terminology in the materials appended to the present disclosure and those described in the present disclosure, the descriptions, definitions, and/or use of terminology in the present disclosure shall prevail.

In closing, it should be understood that the embodiments described in the present disclosure are intended only to illustrate the principles of the embodiments of the present disclosure. Other deformations may also fall within the scope of the present disclosure. Thus, by way of example and not limitation, alternative configurations of embodiments of the present disclosure may be considered consistent with the teachings of the present disclosure. Accordingly, the embodiments of the present disclosure are not limited to the embodiments expressly presented and described herein.

What is claimed is:

1. A radiofrequency coil, comprising at least one coil portion, a transmission line, and a preamplifier; wherein, each of the at least one coil portion includes one or more flexible protective layers and one or more flexible coil units, and the one or more flexible coil units are disposed on the one or more flexible protective layers and used to receive a magnetic resonance (MR) signal of an object;

the at least one coil portion includes a first array and a second array, the first array being configured to be disposed about a first part of the object with a first curvature, the second array being configured to be disposed about a second part of the object with a second curvature, or form a hyperbolic surface structure;

a first end of the transmission line is connected to the one or more flexible coil units, a second end of the transmission line extends outside the one or more flexible protective layers, the transmission line is used to achieve impedance matching between the one or more flexible coil units; the transmission line is a flexible conductive wire; the impedance matching is achieved by designing a size of the transmission line to provide a characteristic impedance for the one or more flexible coil units; and the preamplifier is disposed outside a carrying range of the one or more flexible protective layers, and the preamplifier is connected to the second end of the transmission line extending outside the one or more flexible protective layers.

2. The radiofrequency coil of claim 1, wherein the one or more flexible protective layers and the one or more flexible coil units are void of any capacitive and inductive lumped components.

3. The radiofrequency coil of claim 1, wherein the at least one coil portion further includes a transition part;

the first array, the second array, and the transitional part are separable structures that allow for disassembly connection;

the first array is disposed about a jaw region of the object, the transitional part is disposed about a neck region of the object, and the second array is disposed about a root of the neck region of the object;

the first array is connected with the second array by the transition part to form the hyperbolic surface structure matching the jaw region and the neck region of the object, and a curvature of the transition part is greater than the first curvature and the second curvature.

4. The radiofrequency coil of claim 3, wherein a coil diameter of the flexible coil units in the first array is smaller than a coil diameter of the flexible coil units in the transition part, and the coil diameter of the flexible coil units in the transition part is smaller than a coil diameter of the flexible coil units in the second array.

5. The radiofrequency coil of claim 1, comprising a plurality of flexible coil units, wherein the radiofrequency coil further includes a channel selection controller that is connected to the one or more flexible coil units; and the channel selection controller is configured to identify, from the plurality of flexible coil units, a first flexible coil unit and a second flexible coil unit with an overlapping region of which an area exceeds a preset threshold; and stop receiving channel data from the first flexible coil unit or the second flexible coil unit.

6. The radiofrequency coil of claim 5, wherein the channel selection controller is configured to:

receive channel data from the plurality of flexible coil units;

determine one or more coupling parameters between any two flexible coil units of the plurality of flexible coil units based on a first noise matrix corresponding to the plurality of flexible coil units, the one or more coupling parameters indicating a noise matching status of the any two flexible coil units and being positively related to a degree of overlap between the any two flexible coil units; and designate two flexible coil units with the coupling parameter greater than a preset coupling parameter as the first flexible coil unit and the second flexible coil unit.

7. The radiofrequency coil of claim 5, wherein the channel selection controller is configured to:

determine absolute noise values of the first flexible coil unit and the second flexible coil unit based on a second noise matrix corresponding to the plurality of flexible coil units; and determine, based on the absolute noise values of the first flexible coil unit and the second flexible coil unit, which one of the first flexible coil unit or the second flexible coil unit that the channel selection controller stops receiving channel data from.

8. The radiofrequency coil of claim 1, wherein the one or more flexible protective layers include a first flexible protective layer with an opening structure; and when the opening structure is closed, the first flexible protective layer forms the hyperbolic surface structure and covers a jaw region and a neck region of the object.

9. A radiofrequency coil for magnetic resonance imaging (MRI), comprising at least two coil portions, a transmission line, and a preamplifier; wherein each of the at least two coil portions including one or more flexible protective layers and one or more flexible coil units, with the one or more flexible coil units being disposed on the one or more flexible protective layers and used to receive a magnetic resonance (MR) signal of an object, wherein, at least one of the at least two coil portions is capable of bending in at least two directions, and a structure formed by the bending of the at least one of the at least two coil portions matches a target scanning region of the object;

a first end of the transmission line is connected to the one or more flexible coil units, a second end of the transmission line extends outside the one or more flexible protective layers, the transmission line is used to achieve impedance matching between the one or more flexible coil units; the transmission line is a flexible conductive wire; the impedance matching is achieved by designing a size of the transmission line to provide a characteristic impedance for the one or more flexible coil units; and the preamplifier is disposed outside a carrying range of the one or more flexible protective layers, and the preamplifier is connected to the second end of the transmission line extending outside the one or more flexible protective layers.

10. The radiofrequency coil of claim 9, wherein the at least two coil portions include a first coil portion and a second coil portion;

the first coil portion includes a first main part and a first protruding part;

the second coil portion includes a second main part and a first concave part;

the first protruding part cooperates with the first concave part to join the first coil portion and the second coil portion.

11. The radiofrequency coil of claim 10, wherein the second main part includes a first portion, a second portion, and a third portion, and the first concave part is formed with the second portion and the third portion located at two ends of the first portion, respectively; and the first portion is configured to bend in a first direction, the second portion is configured to bend in a second direction, and the third portion is configured to bend in a third direction.

12. The radiofrequency coil of claim 11, wherein there is an overlapping region between the bent second portion and the bent third portion.

13. The radiofrequency coil of claim 12, wherein the overlapped region is connected by a connecting component.

14. The radiofrequency coil of claim 10, wherein a joining manner of the first coil portion and the second coil portion is seamless joining, layered joining, or overlapping joining.

15. A radiofrequency coil for magnetic resonance imaging (MRI), comprising at least one coil portion, a transmission line, and a preamplifier; wherein, each of the at least one coil portion includes one or more flexible protective layers and one or more flexible coil units, the one or more flexible coil units are disposed on the one or more flexible protective layers and used to receive a magnetic resonance (MR) signal of an object;

a first end of the transmission line is connected to the one or more flexible coil units, a second end of the transmission line extends outside the one or more flexible protective layers, the transmission line is used to achieve impedance matching between the one or more flexible coil units; the transmission line is a flexible conductive wire; the impedance matching is achieved by designing a size of the transmission line to provide a characteristic impedance for the one or more flexible coil units; and the preamplifier is disposed outside a carrying range of the one or more flexible protective layers, and the preamplifier is connected to the second end of the transmission line extending outside the one or more flexible protective layers.

16. The radiofrequency coil of claim 15, wherein the radiofrequency coil includes at least two coil portions, at least one of the at least two coil portions is capable of bending in at least two directions, and a structure formed by the bending of the at least one of the at least two coil portions matches a target scanning region of the object.

17. The radiofrequency coil of claim 15, wherein an electrical length of the transmission line for signal transmission is determined based on a wavelength of magnetic resonance signals to achieve the impedance matching.

18. The radiofrequency coil of claim 15, wherein the one or more flexible coil units include a transmission section for tuning, the one or more flexible coil units include a core wire and a ground wire, and the transmission section includes at least one of a first transmission section used to be equivalent to capacitance or a second transmission section used to be equivalent to inductance; and in the first transmission section, the core wire is connected, while the ground wire is disconnected, and in the second transmission section, the core wire is disconnected while the ground wire is connected.

* * * * *